US010854275B2

(12) United States Patent
Son

(10) Patent No.: US 10,854,275 B2
(45) Date of Patent: Dec. 1, 2020

(54) MEMORY DEVICE AND OPERATION METHOD THEREOF

(71) Applicant: Samsung Electronics Co., Ltd., Suwon-si (KR)

(72) Inventor: Jongpil Son, Seongnam-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/363,386

(22) Filed: Mar. 25, 2019

(65) Prior Publication Data

US 2020/0013451 A1    Jan. 9, 2020

(30) Foreign Application Priority Data

Jul. 3, 2018  (KR) .................. 10-2018-0076893

(51) Int. Cl.
| | |
|---|---|
| *G11C 11/408* | (2006.01) |
| *G11C 11/4093* | (2006.01) |
| *G11C 7/10* | (2006.01) |
| *G11C 11/406* | (2006.01) |
| *G11C 11/4076* | (2006.01) |
| *G11C 7/12* | (2006.01) |

(52) U.S. Cl.
CPC ........ *G11C 11/4087* (2013.01); *G11C 7/1048* (2013.01); *G11C 11/4093* (2013.01); *G11C 7/12* (2013.01); *G11C 11/406* (2013.01); *G11C 11/4076* (2013.01); *G11C 2207/229* (2013.01)

(58) Field of Classification Search
CPC .............. G11C 11/4087; G11C 7/1048; G11C 11/4093

USPC ..................................... 365/230.01
See application file for complete search history.

(56) References Cited

U.S. PATENT DOCUMENTS

| | | | |
|---|---|---|---|
| 5,818,790 A | 10/1998 | Kim et al. | |
| 6,292,429 B1 | 9/2001 | Furutani et al. | |
| 7,177,214 B2 | 2/2007 | Lee | |
| 7,808,858 B2 | 10/2010 | Lee et al. | |
| 9,589,625 B2 * | 3/2017 | Kim .................. | G11C 11/4074 |
| 9,892,779 B2 * | 2/2018 | Kang .................. | G06F 3/0619 |

(Continued)

FOREIGN PATENT DOCUMENTS

| | | |
|---|---|---|
| KR | 10-0167690 B1 | 2/1999 |
| KR | 10-0408719 B1 | 12/2003 |
| KR | 10-1020285 B1 | 3/2011 |

*Primary Examiner* — Ly D Pham
(74) *Attorney, Agent, or Firm* — Harness, Dickey & Pierce, P.L.C.

(57) ABSTRACT

An operation method of a memory device which includes a plurality of memory cells connected to a plurality of word lines includes receiving a first activate command from an external device, receiving at least one operation command from the external device after the first activate command is received, receiving a precharge command after receiving the at least one operation command, and receiving a second activate command from the external device after the precharge command is received. When the at least one operation command does not include a write command, the second activate command is received after a first precharge reference time elapses from a time at which the precharge command is received. When the at least one operation command includes the write command, the second activate command is received after a second precharge reference time elapses from the time at which the precharge command is received.

19 Claims, 18 Drawing Sheets

(56) References Cited

U.S. PATENT DOCUMENTS

| | | | |
|---|---|---|---|
| 10,176,852 B2 * | 1/2019 | Park | G11C 7/1027 |
| 10,224,093 B2 * | 3/2019 | Kim | G11C 11/4097 |
| 10,497,427 B2 * | 12/2019 | Kim | G11C 11/4093 |
| 10,559,550 B2 * | 2/2020 | Lee | G11C 7/1084 |
| 2017/0362827 A1 | 12/2017 | Geiger | |

* cited by examiner

MEMORY DEVICE AND OPERATION METHOD THEREOF

CROSS-REFERENCE TO RELATED APPLICATIONS

This U.S. non-provisional application claims the benefit of priority under 35 U.S.C. § 119 to Korean Patent Application No. 10-2018-0076893, filed on Jul. 3, 2018, in the Korean Intellectual Property Office (KIPO), the disclosure of which is incorporated by reference herein in its entirety.

BACKGROUND

Various example embodiments of the inventive concepts relate to a semiconductor memory, and more particularly, relate to a memory device, a semiconductor memory system, and/or an operation method thereof.

Semiconductor memories are classified into volatile memory devices, in which stored data disappear when power to the volatile memory device is interrupted, such as a static random access memory (SRAM) and/or a dynamic random access memory (DRAM), etc.; and a nonvolatile memory device, in which stored data is retained even when power to the non-volatile memory device is interrupted, such as a flash memory device, a phase-change RAM (PRAM), a magnetic RAM (MRAM), a resistive RAM (RRAM), and/or a ferroelectric RAM (FRAM), etc.

Since a DRAM device has a fast operating speed, the DRAM device is used widely as a buffer memory, a system memory, or a working memory of a computing system. Under the control of a memory controller, a general DRAM device activates a word line and performs a read/write operation on memory cells connected to the activated word line. In this case, various disturbances occur within a memory device due to a high voltage provided to a word line, thereby making the reliability of the memory device low.

SUMMARY

Various example embodiments of the inventive concepts provide a memory device with improved reliability and/or an operation method thereof.

According to at least one example embodiment, an operation method of a memory device, the memory device including a plurality of dynamic random access memory (DRAM) cells connected to a plurality of word lines, the method receiving a first activate command from an external source, receiving at least one operation command from the external source, receiving a precharge command, determining whether the at least one operation command includes a write command, and based on results of the determining receiving a second activate command from the external source after a first precharge reference time period elapses, the first precharge reference time period starting at a time when the precharge command is received, or receiving the second activate command from the external source after a second precharge reference time period elapses, the second precharge reference time period starting at the time when the precharge command is received.

According to at least one example embodiment, an operation method of a memory device, the memory device including a plurality of memory cells connected to a plurality of word lines, the method includes receiving an activate command from an external source, receiving at least one operation command from the external source, determining whether the at least one operation command includes a write command, and based on results of the determining writing write data corresponding to the write command to selection memory cells connected to a selection word line among the plurality of word lines.

According to at least one example embodiment, a memory device includes a memory cell array that includes a plurality of memory cells connected to a plurality of word lines and a plurality of bit lines, a row decoder configured to select a selection word line among the plurality of word lines based on a row address from an external source, a column decoder configured to select a selection bit line among the plurality of bit lines based on a column address from the external source, an input/output circuit connected to the plurality of bit lines and configured to exchange data with the external source, a command decoder configured to decode an activate command, at least one operation command, and a precharge command received from the external source, a write command detector circuit configured to detect a write command from the at least one operation command based on a decoding result of the command decoder, and a control logic circuit configured to activate the selection word line in response to the activate command and in response to the write command being detected, the control logic circuit is further configured to write data corresponding to the write command to selection memory cells from among the plurality of DRAM memory cells, the selection memory cells being connected to the selection word line, after receiving the precharge command.

According to at least one example embodiment, a memory device includes a plurality of memory cells connected to a plurality of word lines. An operation method of the memory device comprises receiving a first activate command from an external source, receiving at least one operation command from the external source, receiving a precharge command, determining whether the at least one operation command includes a write command, and in response to results of the determining indicating that the at least one operation command does not include the write command, entering an idle state after a first precharge reference time period elapses, the first precharge reference time period starting from a time when the precharge command is received, and in response to the results of the determining indicating that the at least one operation command includes the write command, entering the idle state after a second precharge reference time period elapses, the second precharge reference time period starting from the time at which the precharge command is received.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, various example embodiments may be described in detail and clearly to such an extent that an ordinary one in the art can implement the inventive concepts.

Figure 1:
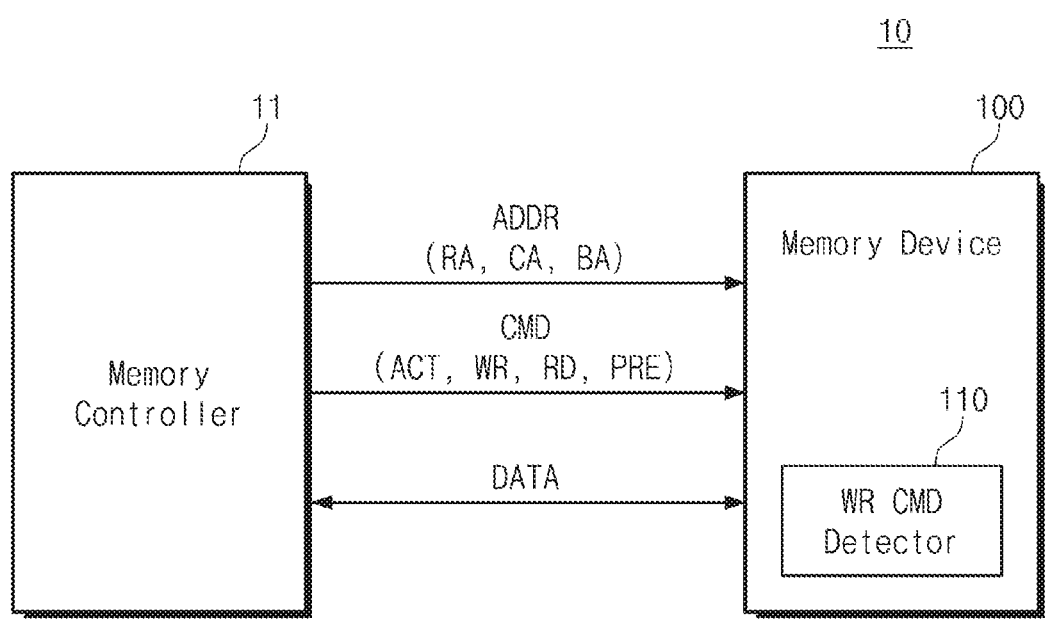
FIG. 1 is a block diagram illustrating a memory system according to at least one example embodiment of the inventive concepts.

FIG. 1 is a block diagram illustrating a memory system according to at least one example embodiment of the inventive concepts. Referring to FIG. 1, a memory system 10 may include a memory controller 11 and/or a memory device 100, etc., but the example embodiments are not limited thereto. The memory controller 11 may transmit an address ADDR and/or a command CMD, etc., to the memory device 100 for the purpose of storing data "DATA" to the memory device 100 and/or reading data "DATA" stored in the memory device 100.

In at least one example embodiment, the address ADDR may include a row address RA, a column address CA, a bank address BA, etc., and the command CMD may include an activate command ACT, a write command WR, a read command RD, and/or a precharge command PRE. However, the example embodiments are not limited thereto, and the address ADDR and the command CMD may include various forms of addresses and commands.

Under control of the memory controller 11, the memory device 100 may store data "DATA" provided from the memory controller 11 and/or may provide the stored data "DATA" to the memory controller 11.

Below, to describe the example embodiments of the inventive concepts easily, it is assumed that the memory device 100 is a dynamic random access memory (DRAM) and the memory controller 11 and the memory device 100 communicate with each other based on a double data rate (DDR) interface. However, the example embodiments are not limited thereto. The memory device 100 may be any one of various memory devices such as an SRAM, an SDRAM, an MRAM, an FRAM, an ReRAM, and/or a PRAM, etc., and the memory controller 11 and the memory device 100 may communicate with each other based on any one of various memory interfaces such as a low power DDR (LPDDR) interface, a universal serial bus (USB) interface, a multimedia card (MMC) interface, a peripheral component interconnect (PCI) interface, a PCI-express (PCI-E) interface, an advanced technology attachment (ATA) interface, a serial ATA (SATA) interface, a parallel ATA (PATA) interface, a small computer system interface (SCSI), an enhanced small disk interface (ESDI), and an integrated drive electronics (IDE) interface, a nonvolatile memory express (NVMe) interface, a universal flash storage (UFS) interface, etc.

In at least one example embodiment, the memory device 100 may include a write command detector 110. The write command detector 110 may be configured to detect the write command WR from among commands CMD provided from the memory controller 11.

For example, to perform a read operation and/or a write operation, etc., of the memory device 100, the memory controller 11 may provide the activate command ACT and the row address RA to the memory device 100. The memory device 100 may activate and/or open a word line corresponding to the row address RA in response to the activate command ACT. Afterwards, the memory controller 11 may transmit the read command RD to the memory device 100 for the purpose of reading data stored in memory cells connected to the activated word line, and/or may transmit the write command WR to the memory device 100 for the purpose of storing (e.g., writing) data to the memory cells connected to the activated word line. The write command detector 110 may be configured to detect the write command WR among commands CMD provided from the memory controller 11. Afterwards, the memory controller 11 may transmit the precharge command PRE to the memory device 100 for the purpose of deactivating and/or closing the activated word line.

In at least one example embodiment, the memory device 100 may transmit the data "DATA" to the memory controller 11 in response to the read command RD received between the activate command ACT and the precharge command PRE. In contrast, after the precharge command PRE is received, the memory device 100 may perform a write operation corresponding to the write command WR received between the activate command ACT and the precharge command PRE.

In other words, the memory device 100 may not perform a direct write operation in response to the write command WR received between the activate command ACT and the precharge command PRE, and the direct write operation corresponding to the received write command WR may be performed in response to the precharge command PRE. Here, the direct write operation refers to an operation of directly and/or physically storing data to memory cells connected to the activated word line. In at least one example embodiment, even though a write operation is not performed, write data provided from the memory controller 11 may be set (e.g., sent, etc.) to a separate input/output circuit.

Below, for convenience of description, it is assumed that an operation of setting the write data provided from the memory controller 11 to the input/output circuit is called a "data input operation" and an operation in which the memory device 100 directly and/or physically writes data to memory cells is called a "cell write operation".

A general DRAM device may receive the precharge command PRE and may receive a next activate command ACT after a precharge reference time (e.g., a desired precharge time/period, etc.) elapses. In this case, the precharge reference time may be a time which is determined, e.g., in advance, to deactivate an activated word line and/or transmitting/receiving read data or write data.

In the case where the write command WR does not exist between the activate command ACT and the precharge command PRE, the memory device 100 of at least one example embodiment of the inventive concepts may receive the activate command ACT after a first precharge reference time tRP1 elapses from a time at which the precharge command PRE is received. In the case where the write command WR exists between the activate command ACT and the precharge command PRE, the memory device 100 may receive the activate command ACT after a second precharge reference time tRP2 elapses from a time at which the precharge command PRE is received.

Here, the second precharge reference time tRP2 may be longer than the first precharge reference time tRP1. This is to secure a time for the cell write operation because the cell write operation is performed in response to the precharge command PRE in the case where the write command WR exists between the activate command ACT and the precharge command PRE.

As described above, the memory device 100 according to at least one example embodiment of the inventive concepts may determine whether the write command WR exists between the activate command ACT and the precharge command PRE and may adjust the precharge reference time and a time point of the cell write operation corresponding to the write command WR, based on a result of the determination. A configuration and an operation method of the memory device 100 will be more fully described with reference to the following drawings.

Figure 2:
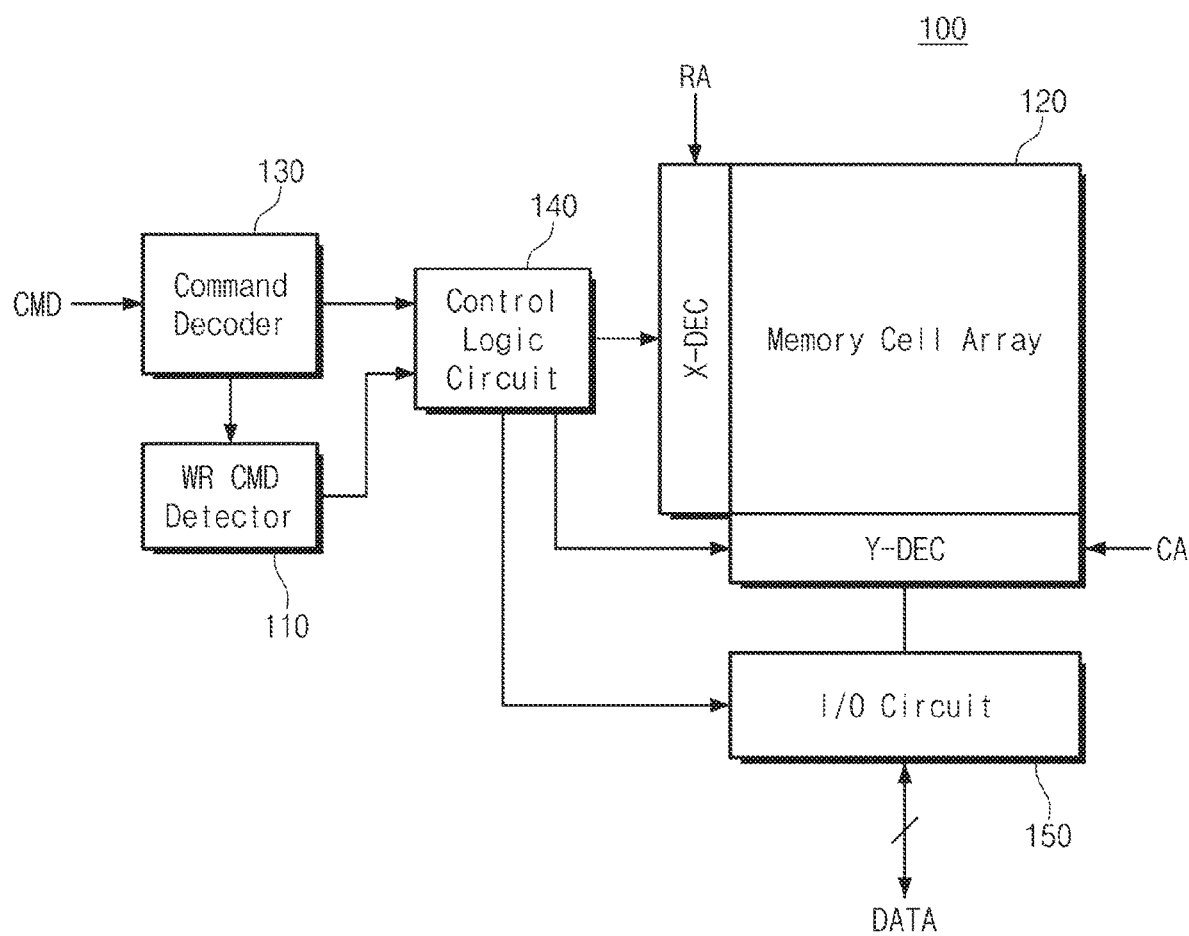
FIG. 2 is a block diagram illustrating a memory device of FIG. 1 according to at least one example embodiment.

FIG. 2 is a block diagram illustrating a memory device of FIG. 1 according to at least one example embodiment. Referring to FIGS. 1 and 2, the memory device 100 may include the write command detector 110, a memory cell array 120, a command decoder 130, a control logic circuit 140, and/or an input/output circuit 150, but the example embodiments are not limited thereto and may contain a lesser or greater number of constituent components.

The write command detector 110 may detect whether the write command WR is present in the commands CMD provided from the memory controller 11. For example, the command decoder 130 may receive the command CMD from the memory controller 11 and may decode the received command CMD. In at least one example embodiment, the command CMD may include various kinds of commands such as the write command WR, the read command RD, the activate command ACT, and/or the precharge command PRE, etc.

The write command detector 110 may determine whether the received command CMD is the write command WR, based on a decoding result of the command decoder 130. In detail, the write command detector 110 may determine whether the write command WR exists between the activate command ACT and the precharge command PRE, based on the decoding result of the command decoder 130. A result of the determination may be provided to the control logic circuit 140.

The memory cell array 120 may include a plurality of memory cells. The plurality of memory cells may be connected to a plurality of word lines and a plurality of bit lines. The word lines may be connected to a X-decoder X-DEC, and the bit lines may be connected to an Y-decoder Y-DEC.

The control logic circuit 140 may control components of the memory device 100 based on the decoding result from the command decoder 130. For example, in the case where the decoding result of the command decoder 130 indicates that the received command CMD is the activate command ACT, the control logic circuit 140 may control the X-decoder X-DEC such that a word line corresponding to the row address RA received together with the activate command ACT is activated. In this case, data which are stored in the memory cells connected to the activated word line may be set (e.g., sent, transmitted, output, etc.) to a sense amplifier of the input/output circuit 150. For example, in the case where the decoding result of the command decoder 130 indicates that the received command CMD is the read command RD, the control logic circuit 140 may control the input/output circuit 150 such that data are output from bit lines corresponding to the column address CA received together with the read command RD.

In the case where the decoding result of the command decoder 130 indicates that the received command CMD is the write command WR, the control logic circuit 140 may set write data received from the memory controller 11 to the input/output circuit 150. In this case, the control logic circuit 140 may not perform the cell write operation on the received write data, and the cell write operation may be performed after the precharge command PRE is received.

In the case where the decoding result of the command decoder 130 indicates that the received command CMD is the precharge command PRE, the control logic circuit 140 may control the input/output circuit 150 and the Y-decoder Y-DEC such that bit lines are precharged.

In at least one example embodiment, in the case where the write command WR is detected by the write command detector 110 (in other words, in the case where the write command WR exists between the activate command ACT and the precharge command PRE), the control logic circuit 140 may perform the cell write operation corresponding to the write command WR before performing the above-described precharge operation. That is, after the precharge command PRE is received, the control logic circuit 140 may perform the cell write operation corresponding to the write command WR between the activate command ACT and the precharge command PRE.

Figure 3:
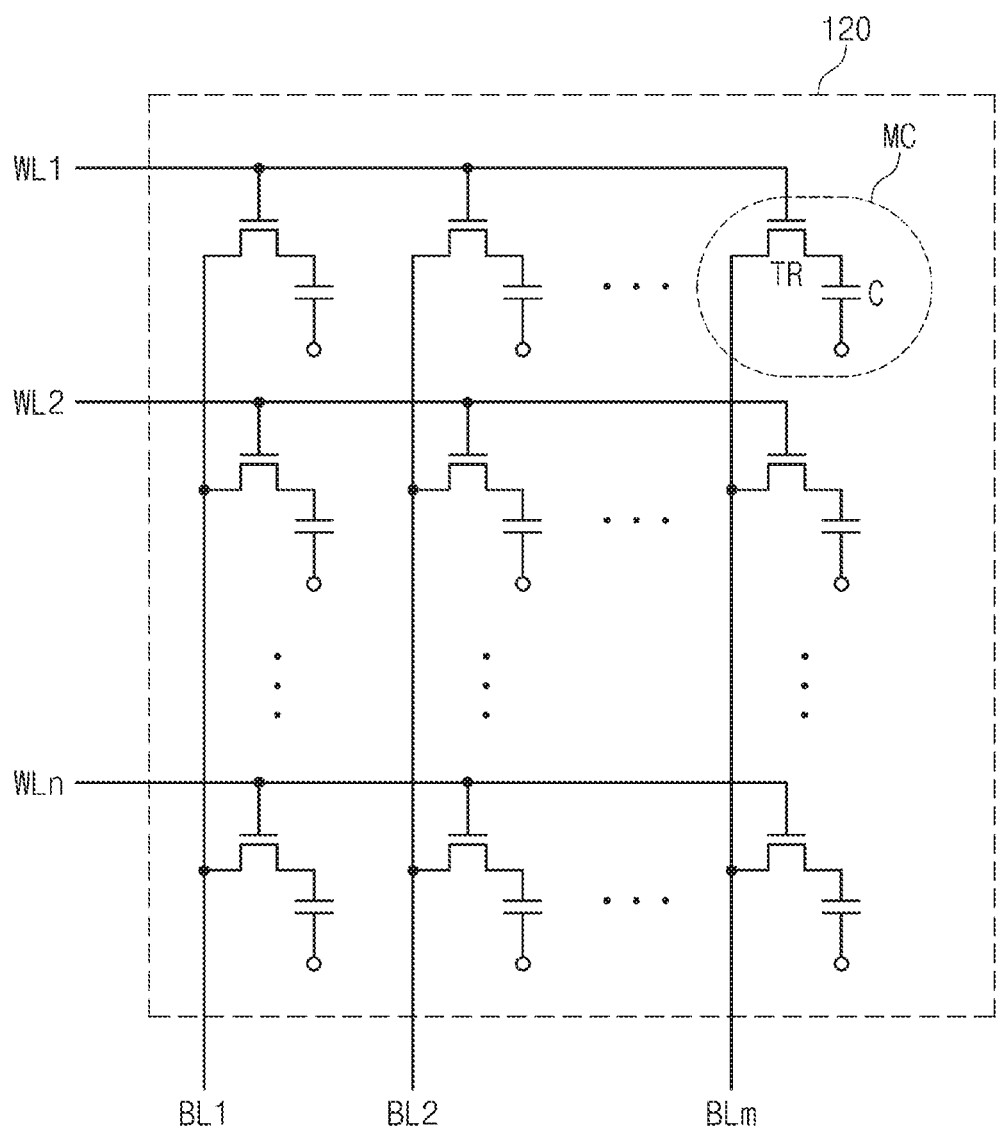
FIG. 3 is a diagram illustrating a memory cell array of FIG. 2 according to at least one example embodiment.

FIG. 3 is a diagram illustrating a memory cell array of FIG. 2 according to at least one example embodiment. For the convenience of description, some memory cells of the memory cell array 120 are illustrated in FIG. 3, but the example embodiments of the inventive concepts are not limited thereto. Also, a memory cell MC is illustrated in FIG. 3 as being a DRAM cell, but the example embodiments of the inventive concepts are not limited thereto, and the memory cell may be a different type of memory cell.

Referring to FIGS. 2 and 3, the memory cell array 120 may include a plurality of memory cells MC, etc. Each of the memory cells MC may include an access transistor TR and a storage capacitor "C", but are not limited thereto. First ends of the access transistors TR of the memory cells MC are connected to a plurality of bit lines BL1 to BLm, and second ends thereof are connected to first ends of the corresponding storage capacitors "C" of the memory cells MC. Gates of the access transistors TR of the memory cells MC are connected to a plurality of word lines WL1 to WLn. Second ends of the capacitors "C" may be connected to a voltage terminal. The voltage terminal may be connected to a voltage (e.g., a ground voltage or half a power supply voltage) of a particular level (e.g., a desired voltage level).

In at least one example embodiment, as any one of the word lines WL1 to WLn is selected in response to the activate command ACT from the memory controller 11 and the selected word line may be activated, data stored in memory cells connected to the selected word line may be provided to the input/output circuit 150 through a plurality of bit lines BL1 to BLm.

Figure 4:
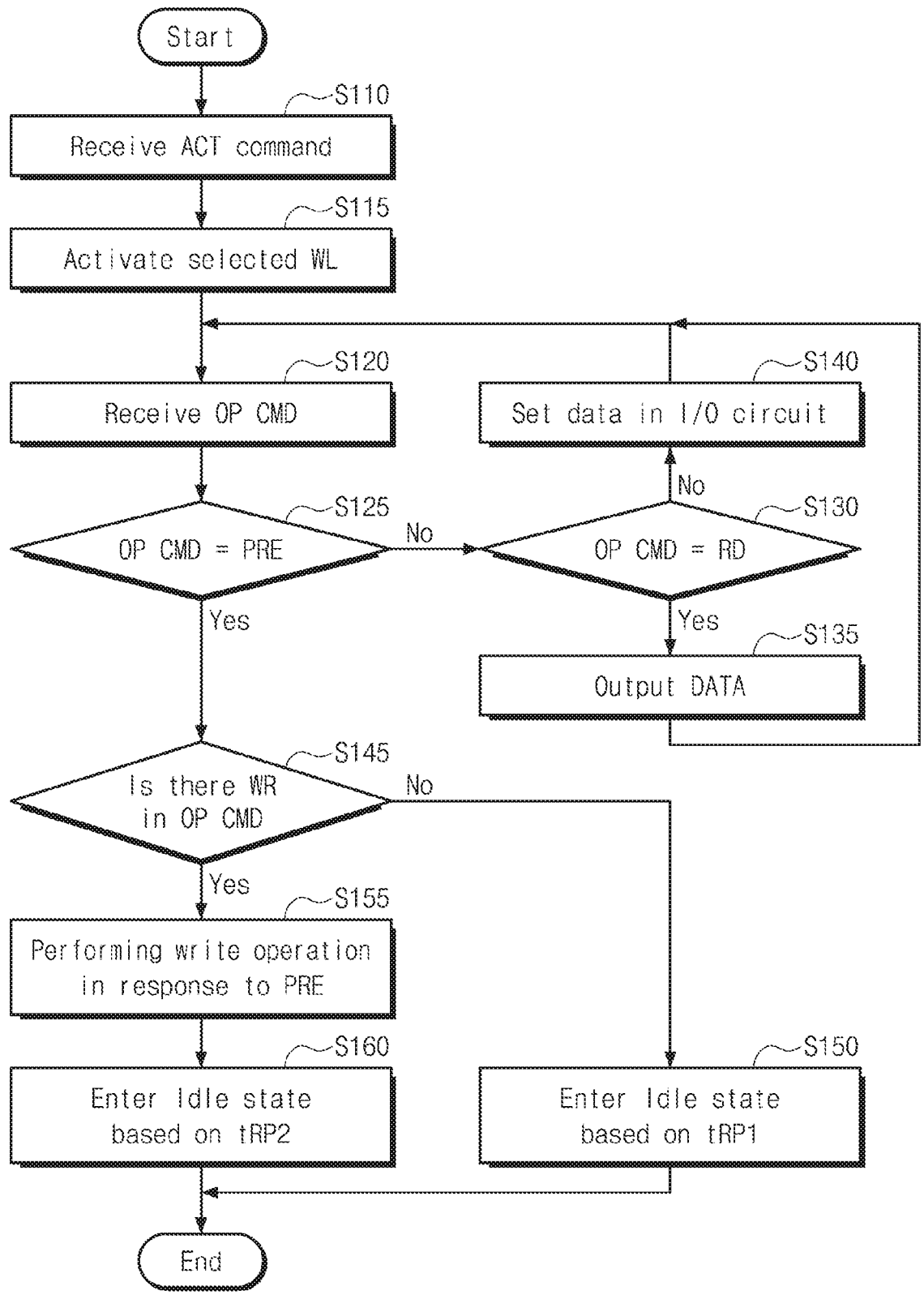
FIG. 4 is a flowchart illustrating an operation method of a memory device of FIG. 1 according to at least one example embodiment.

FIG. 4 is a flowchart illustrating an operation method of a memory device of FIG. 1 according to at least one example embodiment. Below, for the convenience of description, it is assumed that an operation command OP CMD from the memory controller 11 is the read command RD, the write command WR, and/or the precharge command PRE, etc. However, the example embodiments of the inventive concepts are not limited thereto, and the operation command OP CMD may include various commands for controlling any other operation.

Referring to FIGS. 1 to 4, in operation S105, the memory device 100 may receive the activate command ACT from the memory controller 11, but the example embodiments are not limited thereto.

In operation S115, the memory device 100 may activate a selected word line in response to the activate command ACT. For example, in response to the activate command ACT, the memory device 100 may select a word line corresponding to the row address RA received from the memory controller 11 and may activate the selected word line. In at least one example embodiment, the activation of the selected word line may be performed by applying a high voltage to the selected word line. The high voltage may be a voltage sufficient to turn on access transistors of memory cells connected to the selected word line. In at least one example embodiment, the row address RA may be received together with the activate command ACT, but the example embodiments are not limited thereto.

In operation S120, the memory device 100 may receive an operation command OP CMD from the memory controller 11. The operation command OP CMD may include a command for controlling an operation of the memory device 100, such as the read command RD, the write command WR, the precharge command PRE, etc.

In operation S125, the memory device 100 may determine whether the received operation command OP CMD is the precharge command PRE. In the case where the received operation command OP CMD is not the precharge command PRE, in operation S130, the memory device 100 may determine whether the received operation command OP CMD is the read command RD.

In the case where the received operation command OP CMD is the read command RD, in operation S135, the memory device 100 may output data to the memory controller 11 in response to the received operation command OP CMD (i.e., the read command RD). For example, in operation S115, as the memory device 100 activates the selected word line, data stored in the memory cells connected to the selected word line may be set (e.g., sent, transmitted, outputted, etc.) to a sense amplifier unit of the input/output circuit 150. The memory device 100 may provide the data set to the sense amplifier unit to the memory controller 11 through an input/output line(s) in response to the read command RD.

In the case where the received operation command OP CMD is not the read command RD (i.e., is the write command WR, etc.), in operation S140, the memory device 100 may set and/or store write data received from the memory controller 11 to the input/output circuit 150.

After operation S135 or operation S140, the memory device 100 may perform operation S120. In at least one example embodiment, the memory device 100 may repeatedly perform operation S120 to operation S140 until the precharge command PRE is received from the memory controller 11, but the example embodiments are not limited thereto.

In the case where the operation command OP CMD received from the memory controller 11 is the precharge command PRE, in operation S145, the memory device 100 may determine whether the write command WR is present in the received operation commands OP CMD. For example, the write command detector 110 described with reference to FIGS. 1 and 2 may detect whether the write command WR exists (e.g., has been received, etc.) between the activate command ACT and the precharge command PRE. That is, the determination of operation S145 may be performed by the write command detector 110.

In the case where the write command WR is not present in the received operation commands OP CMD (i.e., in the case where the write command WR does not exist between the activate command ACT and the precharge command PRE and/or the write command WR has not been received, etc.), in operation S150, the memory device 100 may enter an idle state based on the first precharge reference time tRP1. For example, the first precharge reference time tRP1 may be a reference time (e.g., a desired time period, etc.) which should be secured from a time at which the precharge command PRE is received, to a time at which a next activate command ACT is received, for the purpose of performing a precharge operation or any other operation (e.g., a data output operation). That is, the memory device 100 may complete an operation (e.g., a read operation), which is associated with the operation command OP CMD not yet performed, during the first precharge reference time tRP1, and may also precharge bit lines, and may enter the idle state, during the first precharge reference time tRP1.

In the case where the write command WR is present in the received operation commands OP CMD (i.e., in the case where the write command WR exists between the activate command ACT and the precharge command PRE), in operation S155, the memory device 100 may perform the cell write operation in response to the precharge command PRE.

For example, as described in operation S130 and operation S140, a write operation (i.e., an operation of writing data to memory cells) corresponding to the write command WR received between the activate command ACT and the precharge command PRE may not be performed. That is, even though the write command WR is received between the activate command ACT and the precharge command PRE, write data corresponding to the write command WR may be stored to the input/output circuit 150 and may not be stored to the memory cell array 120. In an example embodiment, in response to the write command WR being received between the activate command ACT and the precharge command PRE, the write data corresponding to the write command WR is stored in the input/output circuit 150 instead of being stored in the memory cell array 120.

In this case, after the precharge command PRE is received, the memory device 100 may perform the write operation (i.e., an operation of writing write data to a memory cell array) corresponding to the write command WR in response to the precharge command PRE.

In operation S160, the memory device 100 may enter the idle state based on the second precharge reference time tRP2. For example, as in the above description, the second precharge reference time tRP2 may be a reference time (e.g., a desired time period, etc.) which should be secured (e.g., which should have a time long enough to encompass) from a time at which the precharge command PRE is received, to a time at which a next activate command ACT is received, for the purpose of performing a precharge operation or any other operation (e.g., a data output operation). Here, the second precharge reference time tRP2 may be longer than the first precharge reference time tRP1, but the example embodiments are not limited thereto.

In at least one example embodiment, the memory device 100 may enter the idle state after operation S150 or operation S160, and then the memory device 100 which is in the idle state may again perform operation S110.

Figure 5A:
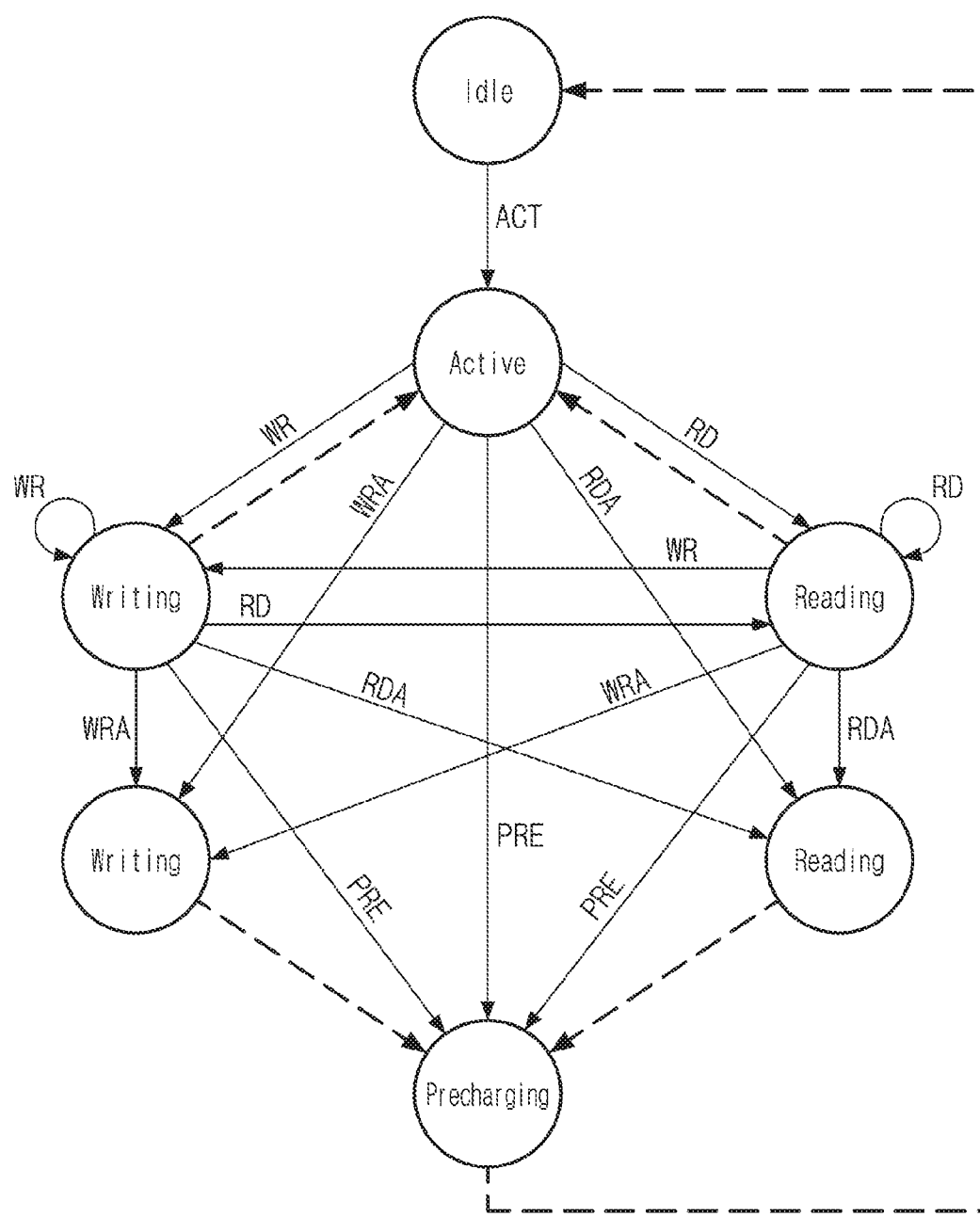
FIGS. 5A and 5B are state diagrams illustrating respective operations of a memory device according to at least one example embodiment.
Figure 5B:
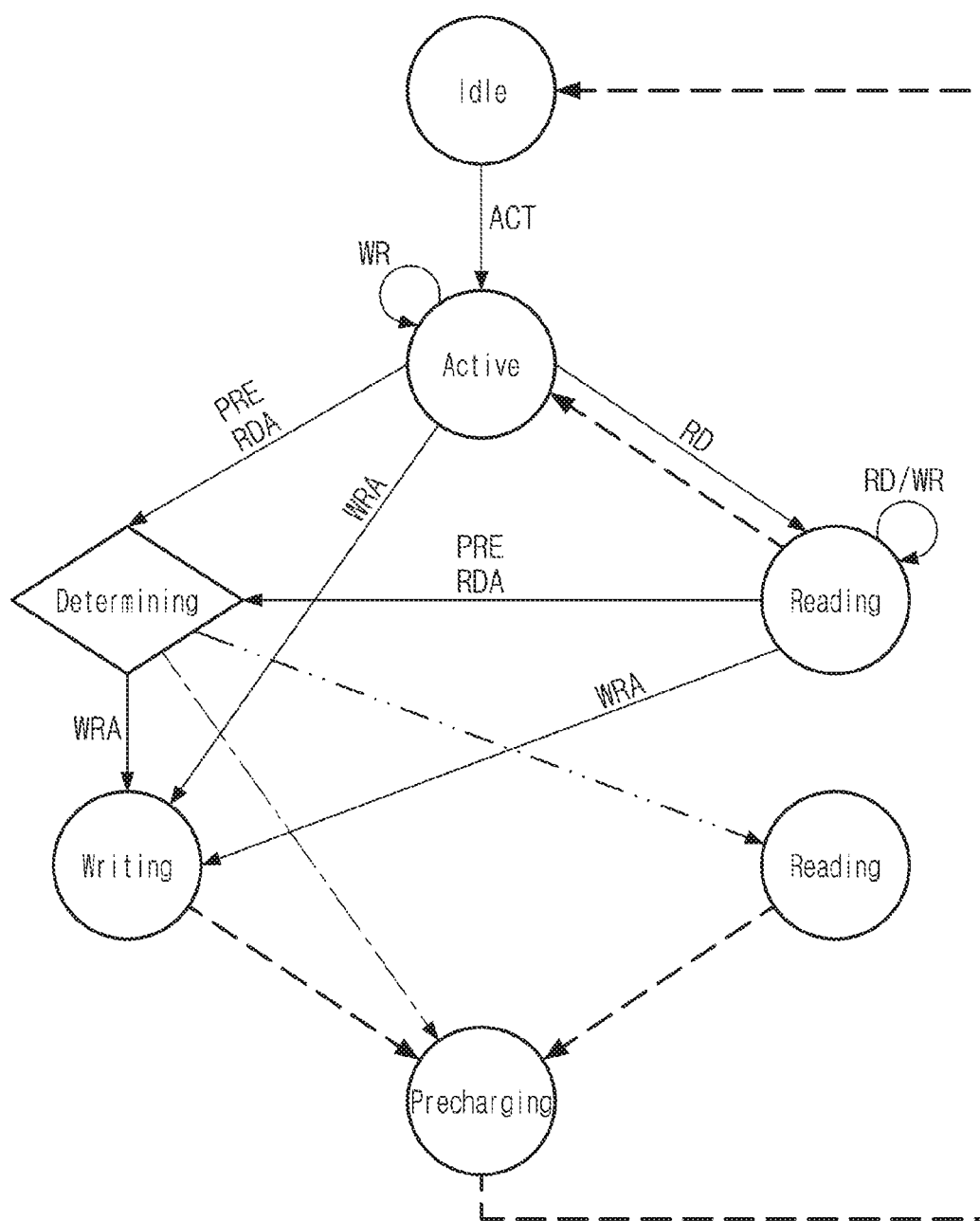

FIGS. 5A and 5B are state diagrams illustrating respective operations of a memory device according to at least one example embodiment. To describe the example embodiments of the inventive concepts clearly, a state diagram of a conventional memory device will be described with reference to FIG. 5A, and a state diagram of the memory device 100 according to at least one example embodiment of the inventive concepts will be described with reference to FIG. 5B. For brevity of illustration and for the convenience of description, components that were previously described are omitted.

In FIGS. 5A and 5B, a dot line indicates an automatic sequence. In FIGS. 5A and 5B, a state transition corresponding to the dot line may be automatically performed without a separate command.

Referring to FIG. 5A, the conventional memory device may enter an active state Active from an idle state Idle in response to the activate command ACT. The active state Active indicates a state in which a selected word line is activated.

The memory device of the active state Active, a write state Writing, or a read state Reading may enter the write state Writing or the read state Reading in response to the write command WR and/or the read command RD, and may enter the active state Active after performing a cell write operation (i.e., an operation of writing data to memory cells) or a read operation (i.e., an operation of outputting data).

The memory device of the active state Active, the write state Writing, or the read state Reading may enter the write state Writing or the read state Reading in response to an auto precharge write command WRA or an auto precharge read command RDA, and may enter a precharge state Precharging after performing a write operation (i.e., an operation of writing data to memory cells) or a read operation (i.e., an operation of outputting data). The auto precharge write command WRA or the auto precharge read command RDA may be a command for performing a precharge operation after completing a write operation and/or a read operation without a separate precharge command PRE.

The memory device which is in the active state Active, the write state Writing, and/or the read state Reading may enter the precharge state Precharging in response to the precharge command PRE. The memory device of the precharge state Precharging may enter the idle state Idle after completing the precharge operation.

As described above, in the case where the conventional memory device receives the auto precharge write command WRA and/or the auto precharge read command RDA before receiving the precharge command PRE, the conventional memory device may enter a state corresponding to each command and may perform the corresponding operation.

In contrast, according to at least one example embodiment of the inventive concepts, the memory device 100 may not perform (e.g., may avoid performing) a separate write operation corresponding to the write command WR received between the activate command ACT and the precharge command PRE, but may instead perform the write operation corresponding to the write command WR after the precharge command PRE is received.

In detail, referring to FIGS. 1 and 5B, the memory device 100 of the idle state Idle may enter the active state Active in response to the activate command ACT.

The memory device 100 of the active state Active and/or the read state Reading may enter the read state Reading in response to the read command RD, and may enter the active state Active after performing a read operation (i.e., the data output operation), but the example embodiments are not limited thereto.

The memory device 100 of the active state Active and/or the read state Reading may not perform (e.g., may avoid performing) the cell write operation in response to the write command WR. That is, unlike the description given with reference to FIG. 5A, in the case where the memory device 100 receives the write command WR in the active state Active and/or the read state Reading, without entering the write state Writing, the memory device 100 may maintain a current state and/or may enter the active state Active. In this case, the data input operation may be performed.

The memory device 100 that is in the active state Active and/or the read state Reading may enter a determination state Determining in response to the precharge command PRE and/or the auto precharge read command RDA. The determination state Determining may be a state in which there is performed an operation of determining whether the write command WR is received during a time interval from a time point when the activate command ACT is received to a current time point (i.e., the precharge command PRE and/or the auto precharge read command RDA). That is, the memory device 100 that is in the determination state Determining may determine whether there exists the write command WR received in a time interval between the activate command ACT and the precharge command PRE (e.g., that the write command WR has been received, etc.), and/or in a time interval between the activate command ACT and the auto precharge read command RDA.

In at least one example embodiment, in the case where the auto precharge read command RDA is received, since a precharge operation is performed after a read operation without a separate precharge command, the memory device 100 may enter the determination state Determining in response to the auto precharge read command RDA, like the precharge command PRE.

In the case where a result of the determination performed in the determination state Determining indicates that the write command WR exists, the memory device 100 may enter the write state Writing and may perform the corresponding write operation. Afterwards, the memory device 100 may enter the precharge state Precharging.

In the case where the result of the determination performed in the determination state Determining indicates that the write command WR does not exist, the memory device 100 may enter the read state Reading or the precharge state Precharging. For example, after the memory device 100 enters the determination state Determining in response to the precharge command PRE, in the case where it is determined that the write command WR does not exist, the memory device 100 may enter the precharge state Precharging (a dot-dash line of FIG. 5B), but the example embodiments are not limited thereto. For example, after the memory device 100 enters the determination state Determining in response to the auto precharge read command RDA, in the case where it is determined that the write command WR does not exist, the memory device 100 may enter the read state Reading (a two dot-dash line of FIG. 5B) and may enter the precharge state Precharging after completing a read operation corresponding to the read state Reading, but the example embodiments are not limited thereto.

The memory device 100 of the active state Active and/or the read state Reading may enter the write state Writing in response to the auto precharge write command WRA, and may enter the precharge state Precharging after completing a write operation corresponding to the write state Writing.

In at least one example embodiment, in the case where the auto precharge write command WRA is received, since a precharge operation is performed after a write operation without a separate precharge command, the memory device 100 may enter the write state Writing, may perform a write operation corresponding to the write state Writing, and may enter the precharge state Precharging.

The memory device 100 of the precharge state Precharging may enter the idle state Idle after completing the precharge operation. In at least one example embodiment, a path through which the memory device 100 enters the idle state Idle from the read state Reading through the precharge state Precharging may be established during the first precharge reference time tRP1. A path through which the memory device 100 enters the idle state Idle from the write state Writing through the precharge state Precharging may be established during the second precharge reference time tRP2, and the second precharge reference time tRP2 may be longer than the first precharge reference time tRP1, but the example embodiments are not limited thereto.

As described above, in the case where the write command WR is received between the activate command ACT and the precharge command PRE, the memory device 100 according to at least one example embodiment of the inventive concepts may perform the direct write operation corresponding to the write command WR in response to the precharge command PRE.

Figure 6A:
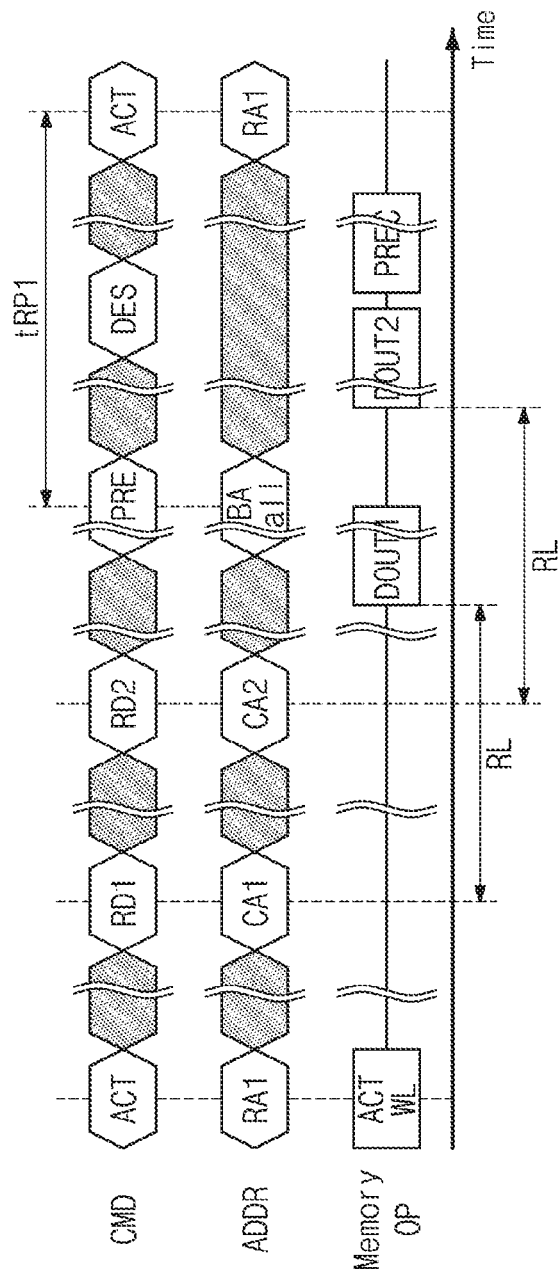
FIGS. 6A and 6B are timing diagrams for describing an operation of a memory device of FIG. 1 according to at least one example embodiment.
Figure 6B:
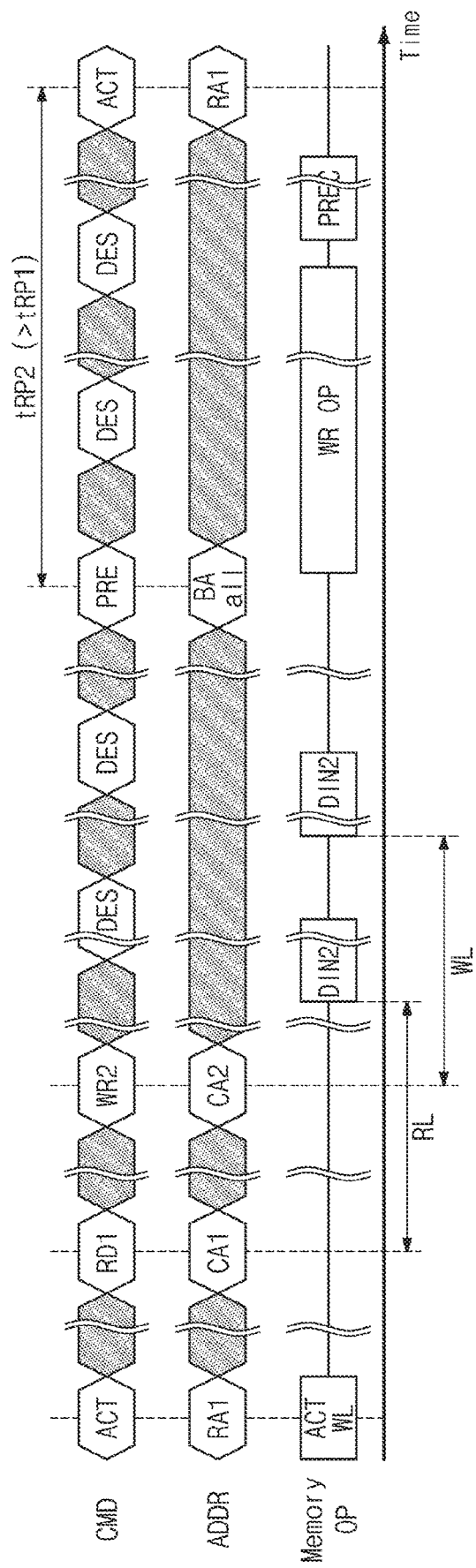

FIGS. 6A and 6B are timing diagrams for describing an operation of a memory device of FIG. 1 according to at least one example embodiment. For the brevity of illustration and for the convenience of description, at least one example embodiment of the inventive concepts will be described with reference to a configuration in which two operation commands are received between the activate command ACT and the precharge command PRE, but the example embodiments of the inventive concepts are not limited thereto. At least one example embodiment in which the write command WR does not exist will be described with reference to FIG. 6A, and at least one example embodiment in which the write command WR exists will be described with reference to FIG. 6B.

Referring to FIGS. 1 and 6A, the memory device 100 may receive the activate command ACT and a first row address RA1 from the memory controller 11. In at least one example embodiment, the first row address RA1 may include information about the bank address BA and/or a bank group, etc. In response to the activate command ACT, the memory device 100 may select a word line corresponding to the first row address RA1 and may activate the selected word line. In at least one example embodiment, as the selected word line is activated, data stored in memory cells connected to the selected word line may be stored to the input/output circuit 150.

Afterwards, the memory device 100 may receive a first read command RD1 and a first column address CA1 from the memory controller 11. Then, the memory device 100 may receive a second read command RD2 and a second column address CA2 from the memory controller 11. Afterwards, the memory device 100 may receive the precharge command PRE and the bank address BA or information "all" about all banks of the memory device 100.

In response to the first read command RD1, the memory device 100 may perform a first data output operation DOUT1 of outputting data corresponding to the first column address CAL after read latency RL (e.g., a read latency period and/or time interval, etc.) from a time at which the first read command RD1 is received. In response to the second read command RD2, the memory device 100 may perform a second data output operation DOUT2 of outputting data corresponding to the second column address CA2 after read latency RL from a time at which the second read command RD2 is received.

In at least one example embodiment, the read latency RL may indicate a time interval from a time at which the first or second read command RD1 or RD2 is received, to a time at which the corresponding data is output. Or, in other words, the read latency RL may refer to the time to complete a read operation starting from when the read operation command was received by the memory device 100 and the data retrieved during the read operation is output to an external source and/or external device, etc., by the memory device 100. The read latency RL may be a value which is determined in advance depending on an interface between the memory controller 11 and the memory device 100.

After the memory device 100 completes the first and second data output operations DOUT1 and DOUT2, the memory device 100 may perform a precharge operation PREC in response to the precharge command PRE. The precharge operation PREC refers to an operation of charging bit lines of the memory device 100 with a precharge voltage. The precharge voltage may be an intermediate value of a bit line voltage corresponding to data "1" and a bit line voltage corresponding to data "0".

The memory device 100 may receive a next (e.g., a second) activate command ACT after the first precharge reference time tRP1 elapses from a time at which the precharge command PRE is received. For example, as illustrated in FIG. 6A, after the precharge command PRE is received, the second data output operation DOUT2 associated with the second read command RD2 received previously may be performed, and then, the precharge operation PREC may be performed. The memory device 100 may perform a word line activation operation corresponding to the activate command ACT after completing the precharge operation PREC.

That is, to allow the memory device 100 to operate normally, after the precharge command PRE is received, a time to perform an operation (e.g., the second data output operation DOUT2) not performed or the precharge operation PREC may be desired and/or required. The first precharge reference time tRP1 may be determined such that the above operation may be performed normally.

As described above, with regard to the read commands RD1 and RD2 received between the activate command ACT and the precharge command PRE, the memory device 100 may perform the first data output operation DOUT1 after the read latency RL from a time at which the first read command RD1 is received and may perform the second data output operation DOUT2 after the read latency RL from a time at which the second read command RD2 is received.

Referring to FIGS. 1 and 6B, the memory device 100 may select and activate a word line in response to the activate command ACT and the first row address RA1 received from the memory controller 11 (e.g., an external source, etc.). The memory device 100 may receive the first read command RD1 and the first column address CA1 and may perform the first data output operation DOUT1 after the read latency RL.

The memory device 100 may receive a second write command WR2 and the second column address CA2, and may perform a second data input operation DIN2 after write latency WL (e.g., a write latency period and/or time interval, etc.). The second data input operation DIN2 refers to an operation of receiving write data to be written to memory cells corresponding to the second column address CA2. The received write data may be stored to the input/output circuit 150 of the memory device 100. In this case, the memory device 100 may not perform any other cell write operation (i.e., an operation of storing input data to memory cells) except for the second data input operation DIN2.

Afterwards, the memory device 100 may receive the precharge command PRE and the bank address BA or information "all" about all banks of the memory device 100. Unlike the example embodiment of FIG. 6A, in the example embodiment of FIG. 6B, since the second write command WR2 exists between the activate command ACT and the precharge command PRE, the memory device 100 may perform a cell write operation WR OP corresponding to the second write command WR2 in response to the precharge command PRE. The cell write operation WR OP refers to an operation of directly writing write data received through the second data input operation DIN2 to the memory cells. After the cell write operation WR OP is completed, the memory device 100 may perform the precharge operation PREC.

In at least one example embodiment, in the case where the write command WR exists between the activate command ACT and the precharge command PRE, since the cell write operation WR OP is performed after the precharge command PRE is received, a time (i.e., the second precharge reference time tRP2) which should be secured from a time at which the precharge command PRE is received to a time at which a next activate command ACT is received may be longer than the first precharge reference time tRP1 described above, but the example embodiments are not limited thereto. The reason is that a time desired and/or necessary for the cell write operation WR OP may be longer than a time desired and/or necessary for the data output operation DOUT.

As described above, in the case where the write command WR is received between the activate command ACT and the precharge command PRE, the memory device 100 of at least one example embodiment of the inventive concepts may perform the cell write operation corresponding to the write command WR after the precharge command PRE is received.

In the case where the write command WR is not received between the activate command ACT and the precharge command PRE, the memory device 100 may receive a next activate command ACT after the first precharge reference time tRP1 elapses from a time at which the precharge command PRE is received. In the case where the write command WR is received between the activate command ACT and the precharge command PRE, for the purpose of securing a time desired and/or necessary for the cell write operation, the memory device 100 may receive a next (e.g., a second) activate command ACT after the second precharge reference time tRP2 elapses from a time at which the precharge command PRE is received. Here, the second precharge reference time tRP2 may be longer than the first precharge reference time tRP1, but the example embodiments are not limited thereto.

In the above example embodiments, a description is given on the basis of the activate command ACT and the precharge command PRE, but the example embodiments of the inventive concepts are not limited thereto. For example, as described with reference to FIGS. 5A and 5B, during a time interval between the activate command ACT and the auto precharge read command RDA, the memory device 100 may determine whether the write command WR exists and may operate based on a result of the determination. For example, the auto precharge read command RDA, which is defined as a precharge operation is automatically performed, may be used instead of the precharge command PRE described above, etc.

Figure 7:
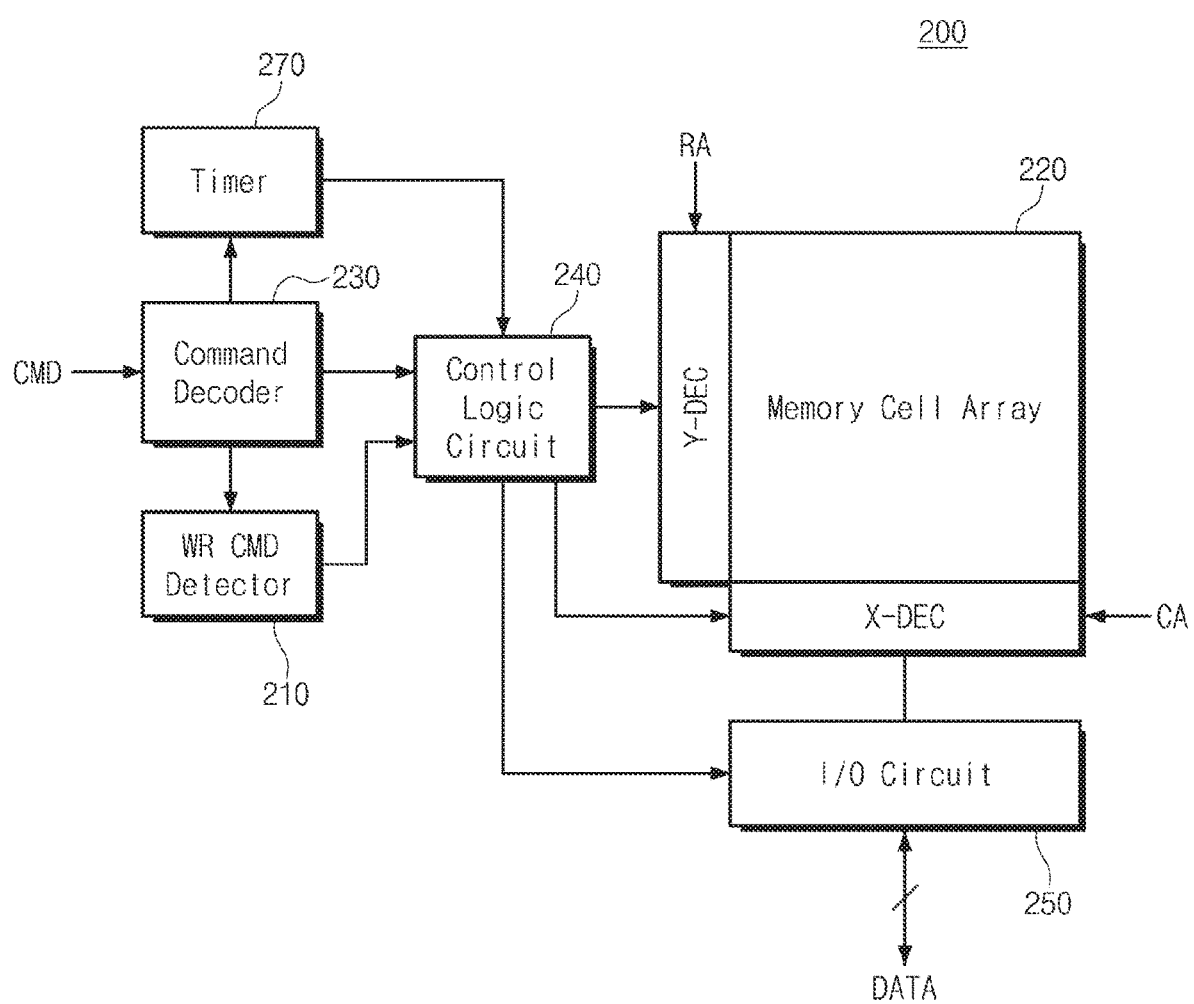
FIG. 7 is a block diagram illustrating a memory device according to at least one example embodiment of the inventive concepts.

FIG. 7 is a block diagram illustrating a memory device according to at least one example embodiment of the inventive concepts. For a brief description, the description given with reference to the above components will not be repeated here. Referring to FIG. 7, a memory device 200 may include a write command detector 210, a memory cell array 220, the Y-decoder Y-DEC, the X-decoder X-DEC, a command decoder 230, a control logic circuit 240, an input/output circuit 250, and/or a timer 270, etc., but the example embodiments are not limited thereto.

The write command detector 210, the memory cell array 220, the Y-decoder Y-DEC, the X-decoder X-DEC, the command decoder 230, the control logic circuit 240, and the input/output circuit 250 are described with reference to FIGS. 1 to 7B, and thus, additional description will be omitted to avoid redundancy.

The timer 270 may be configured to count an activate reference time tRAS from a time at which the activate command ACT was received. For example, the activate reference time tRAS may be a minimum time desired and/or necessary to perform the following operations associated with a selected word line: an activation operation, a sensing operation, a charge sharing operation, and a restore operation, but the example embodiments are not limited thereto. That is, during the activate reference time tRAS, data stored in memory cells connected to the selected word line may be provided and stored to the input/output circuit 250.

In at least one example embodiment, the activate reference time tRAS may be based on a clock signal (not illustrated) provided from a memory controller, and the timer 270 may be configured to count the clock signal. After (or as soon as) the activate reference time tRAS elapses from a time at which the activate command ACT is received, the timer 270 may provide a deactivate signal to the control logic circuit 240.

The control logic circuit 240 may deactivate or close an activated word line in response to the deactivate signal from the timer 270. For example, the control logic circuit 240 may deactivate or close the activated word line by providing a low voltage to the activated word line. The low voltage may be a voltage sufficient to turn off the access transistors of memory cells connected to the selected word line.

A conventional memory device may be configured to activate a selected word line in response to the activate command ACT, to deactivate the selected word line in response to the precharge command PRE, and to precharge the bit lines. In the case where a time interval between a time to receive the activate command ACT and a time to receive the precharge command PRE becomes long, a time when a high voltage is applied to the selected word line may become long. This may mean that a word line voltage being the high voltage causes a disturbance, undesired memory performance and/or memory storage instability.

In contrast, the memory device 200 according to at least one example embodiment of the inventive concepts may activate a selected word line in response to the activate command ACT, and may deactivate the selected word line after the activate reference time tRAS elapses even though the precharge command PRE is not received. In this case, a time when a high voltage is applied to the selected word line may be decreased and/or minimized. This means that the above-described disturbance may be decreased and/or prevented.

In at least one example embodiment, even though the read command RD is received while the selected word line is deactivated, a normal data output operation is possible because data stored in memory cells connected to the selected word line are stored in the input/output circuit 250.

In at least one example embodiment, as described with reference to FIGS. 1 to 6B, in the case where the write command WR is received between the activate command ACT and the precharge command PRE, the control logic circuit 240 may perform the cell write operation corresponding to the write command WR after the precharge command PRE is received.

To perform the cell write operation corresponding to the write command WR after the precharge command PRE is received, the control logic circuit 240 may again activate a deactivated word line without a separate activate command ACT. Accordingly, even though the write command WR is received while the selected word line is deactivated, a normal cell write operation of the memory device 200 is possible because the memory device 200 again activates the selected word line in response to the following precharge command PRE and performs the direct write operation corresponding to the write command WR.

Figure 8:
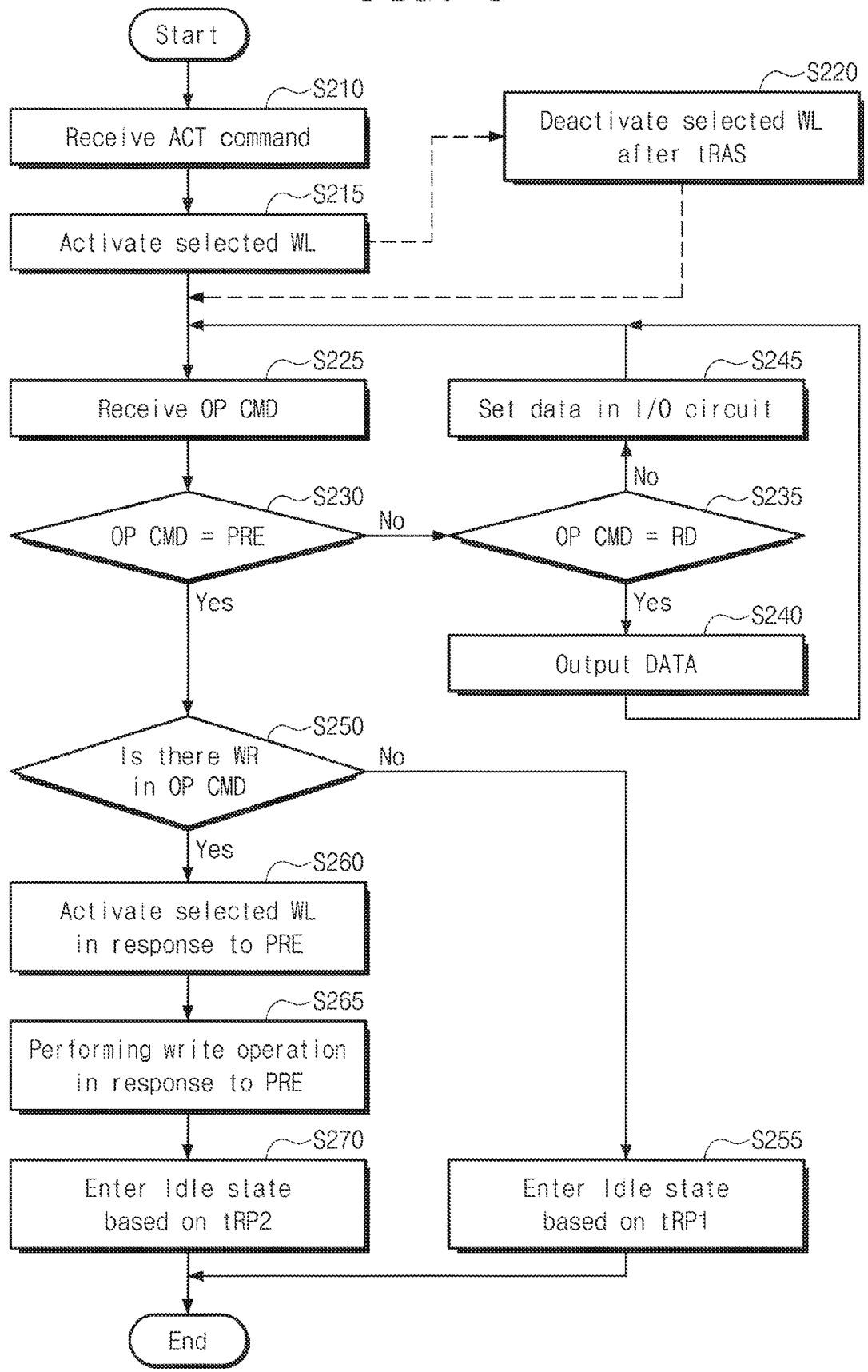
FIG. 8 is a flowchart illustrating an operation method of a memory device of FIG. 7 according to at least one example embodiment.

FIG. 8 is a flowchart illustrating an operation method of a memory device of FIG. 7 according to at least one example embodiment. For a brief description, the description given with reference to the above components will not be repeated here. Referring to FIGS. 7 and 8, the memory device 200 may perform operation S210 and operation S215. Operation S210 and operation S215 are similar to operation S110 and operation S115 of FIG. 4, and thus, additional description will be omitted to avoid redundancy.

In operation S220, the memory device 200 may deactivate a selected word line after the activate reference time tRAS elapses. For example, the memory device 200 may deactivate the selected word line by applying a low voltage to the selected word line.

In at least one example embodiment, operation S220 may overlap with any other operation. For example, operation S220 may be performed after operations S225, operation S230, or operation S235. Alternatively, operation S220 may be performed before operation S225. Alternatively, operation S220 may be performed during the same time period as at least one of operations S225 to S245. A start time point of operation S220 is an example, and may be variously changed depending on a length of the activate reference time tRAS.

Afterwards, the memory device 200 may perform operation S225 to operation S245. Operation S225 to operation S245 may be similar to operation S120 to operation S140 of FIG. 5, and thus, additional description will be omitted to avoid redundancy.

In operation S250, the memory device 200 may determine whether the write command WR is present in the received operation commands OP CMD. If the write command WR does not exist, the memory device 200 performs operation S255. Operation S255 is similar to operation S250 of FIG. 5, and thus, additional description will be omitted to avoid redundancy.

In the case where the write command WR exists, in operation S260, the memory device 200 may activate the selected word line in response to the precharge command PRE. Afterwards, the memory device 200 may perform operation S265 and operation S270. Operation S265 and operation S270 may be similar to operation S160 and operation S165 of FIG. 5, and thus, additional description will be omitted to avoid redundancy.

As described above, the memory device 200 according to at least one example embodiment of the inventive concepts may activate a selected word line in response to the activate command ACT, and may deactivate the selected word line after the activate reference time tRAS elapses. Even though the read command RD is received while the selected word line is deactivated, a normal data output operation is possible because data stored in memory cells connected to the selected word line are stored in the input/output circuit 250.

Also, even though the write command WR is received while the selected word line is deactivated, a normal write operation is possible because a direct write operation is performed after activating the selected word line in response to the precharge command PRE. Accordingly, data disturbance may be decreased and/or prevented by decreasing a time when the selected word line is activated; in addition, a normal operation is possible by activating the selected word line after the precharge command PRE and performing a direct write operation. This may mean that the memory device according to at least one example embodiment that has improved reliability is provided.

Figure 9:
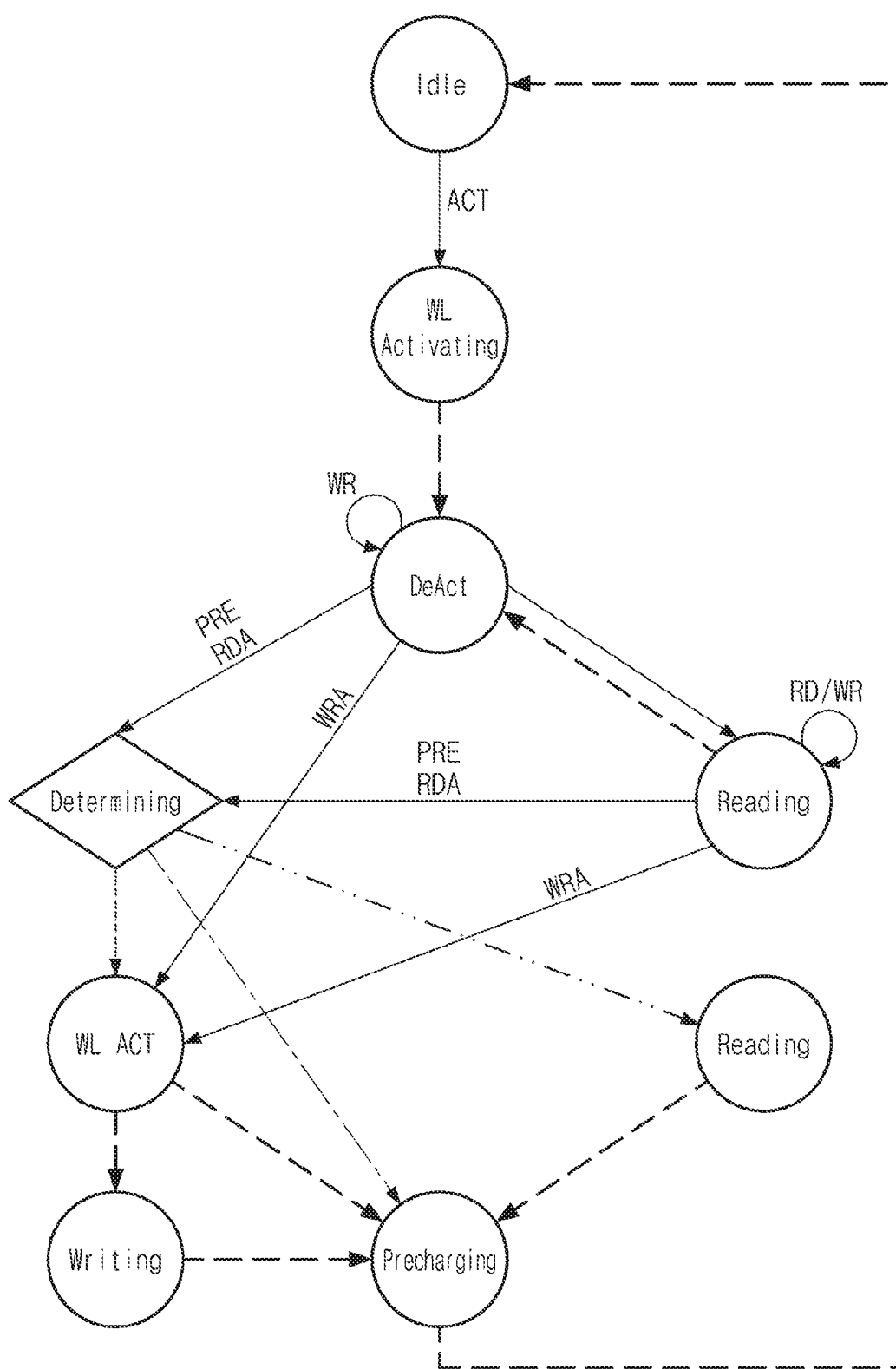
FIG. 9 is a state diagram of a memory device of FIG. 7 according to at least one example embodiment.

FIG. 9 is a state diagram of a memory device of FIG. 7 according to at least one example embodiment. For the brevity of illustration and for convenience of description, components which were previously described are omitted.

Referring to FIGS. 7 and 9, the memory device 200 of the idle state Idle may enter a word line activate state WL Activating in response to the activate command ACT. For example, the memory device 200 of the idle state Idle may apply a high voltage to a selected word line in response to the activate command ACT, and may store data stored in memory cells connected to the selected word line to the input/output circuit 250 (and/or a sense amplifier unit, etc.). Additionally, the memory device 200 of the idle state Idle may apply a high voltage to the selected word line in response to the activate command ACT, and may perform a charge sharing operation, a sensing operation, and/or a restore operation, etc., on the memory cells connected to the selected word line.

The memory device 200 that is in the word line activate state WL Activating may enter a deactivate state DeAct after the activate reference time tRAS elapses. For example, the memory device 200 of the word line activate state WL Activating may deactivate the activated word line by applying a low voltage to the activated word line after the activate reference time tRAS elapses from a time at which the activate command ACT is received.

The memory device 200 that is in the deactivate state DeAct and/or the read state Reading may enter the read state Reading in response to the read command RD, and may perform a data output operation. Afterwards, the memory device 200 may again enter the deactivate state DeAct.

The memory device 200 that is in the deactivate state DeAct and/or the read state Reading may maintain a current state in response to the write command WR. In at least one example embodiment, the memory device 200 that is in the deactivate state DeAct and/or the read state Reading may not perform (e.g., may avoid performing) the cell write operation in response to the write command WR and may perform only (e.g., may instead perform) the data input operation (i.e., an operation of storing write data to an input/output circuit).

The memory device 200 that is in the deactivate state DeAct and/or the read state Reading may enter the determination state Determining in response to the precharge command PRE and the auto precharge read command RDA.

As in the description given with reference to FIG. 6B, the memory device 200 that is in the determination state Determining may determine whether the write command WR exists between the activate command ACT and the precharge command PRE and/or between the activate command ACT and the auto precharge read command RDA.

In the case where a result of the determination performed in the determination state Determining indicates that the write command WR does not exist, the memory device 200 that is in the determination state Determining may enter the read state Reading or the precharge state Precharging. This is described with reference to FIG. 6B, and thus, additional description will be omitted to avoid redundancy.

In the case where the result of the determination performed in the determination state Determining indicates that the write command WR exists, the memory device 200 may enter the word line activate state WL Activating. That is, in the case where the result of the determination performed in the determination state Determining indicates that the write command WR exists, the memory device 200 may activate the selected word line which is in a deactivate state. Afterwards, the memory device 200 that is in the word line activate state WL Activating may enter the write state Writing and may perform the cell write operation corresponding to the write command WR. Afterwards, the memory device 200 may enter the precharge state Precharging.

In response to the auto precharge write command WRA, the memory device 200 that is in the deactivate state DeAct and/or the read state Reading may enter the word line activate state WL Activating and may perform the following operation (i.e., word line activation and/or cell write operations, etc.). Afterwards, the memory device 200 may enter the precharge state Precharging.

The memory device 200 of the precharge state Precharging may enter the idle state Idle after completing a precharge operation. In at least one example embodiment, as in the description given with reference to FIG. 6B, a path through which the memory device 200 enters the idle state Idle from the read state Reading through the precharge state Precharging may be established during the first precharge reference time tRP1. A path through which the memory device 200 enters the idle state Idle from the write state Writing through the precharge state Precharging may be established during the second precharge reference time tRP2, and the second precharge reference time tRP2 may be longer than the first precharge reference time tRP1, but the example embodiments are not limited thereto.

Figure 10A:
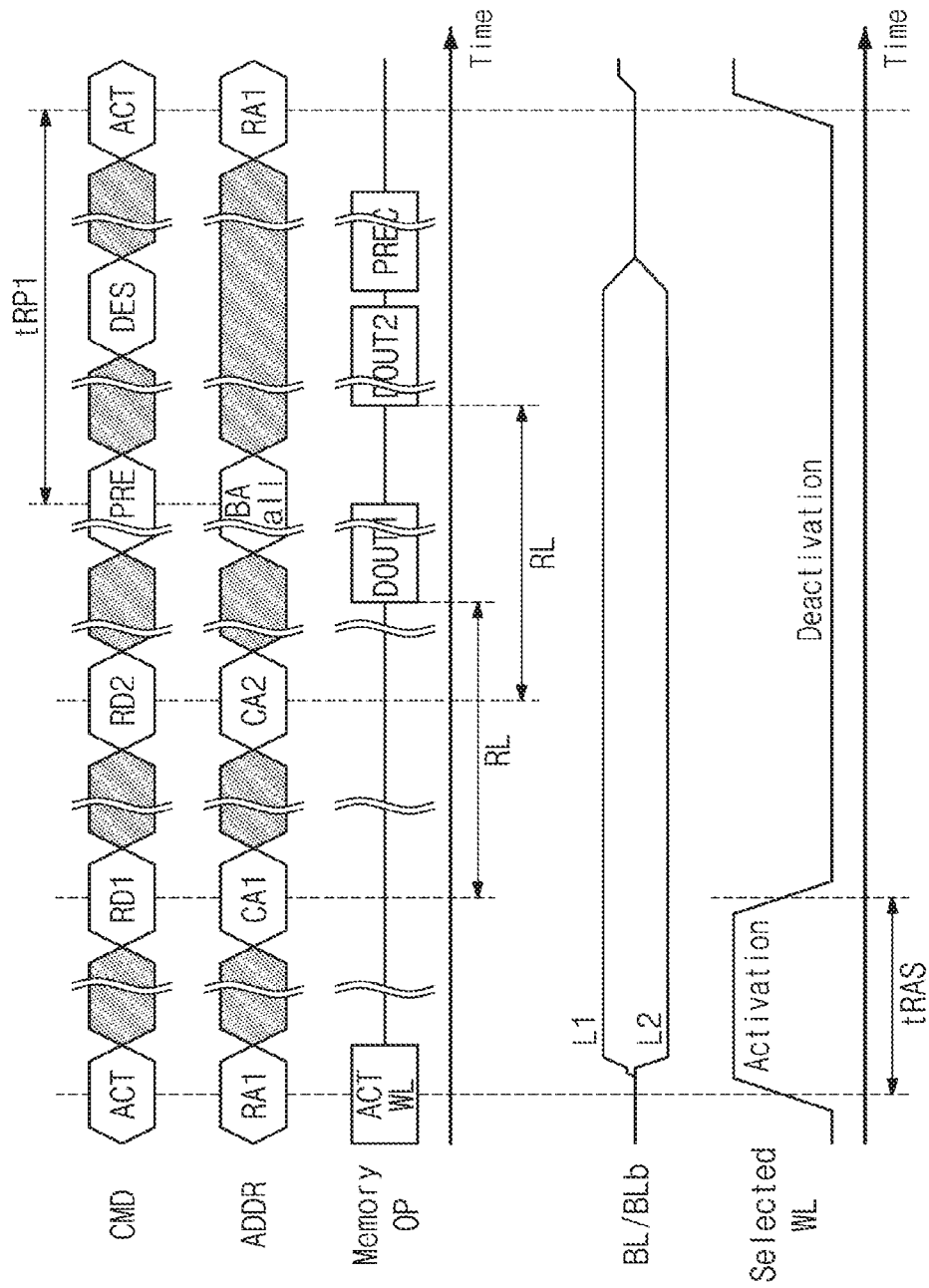
FIGS. 10A and 10B are timing diagrams for describing an operation of a memory device of FIG. 7 according to at least one example embodiment.
Figure 10B:
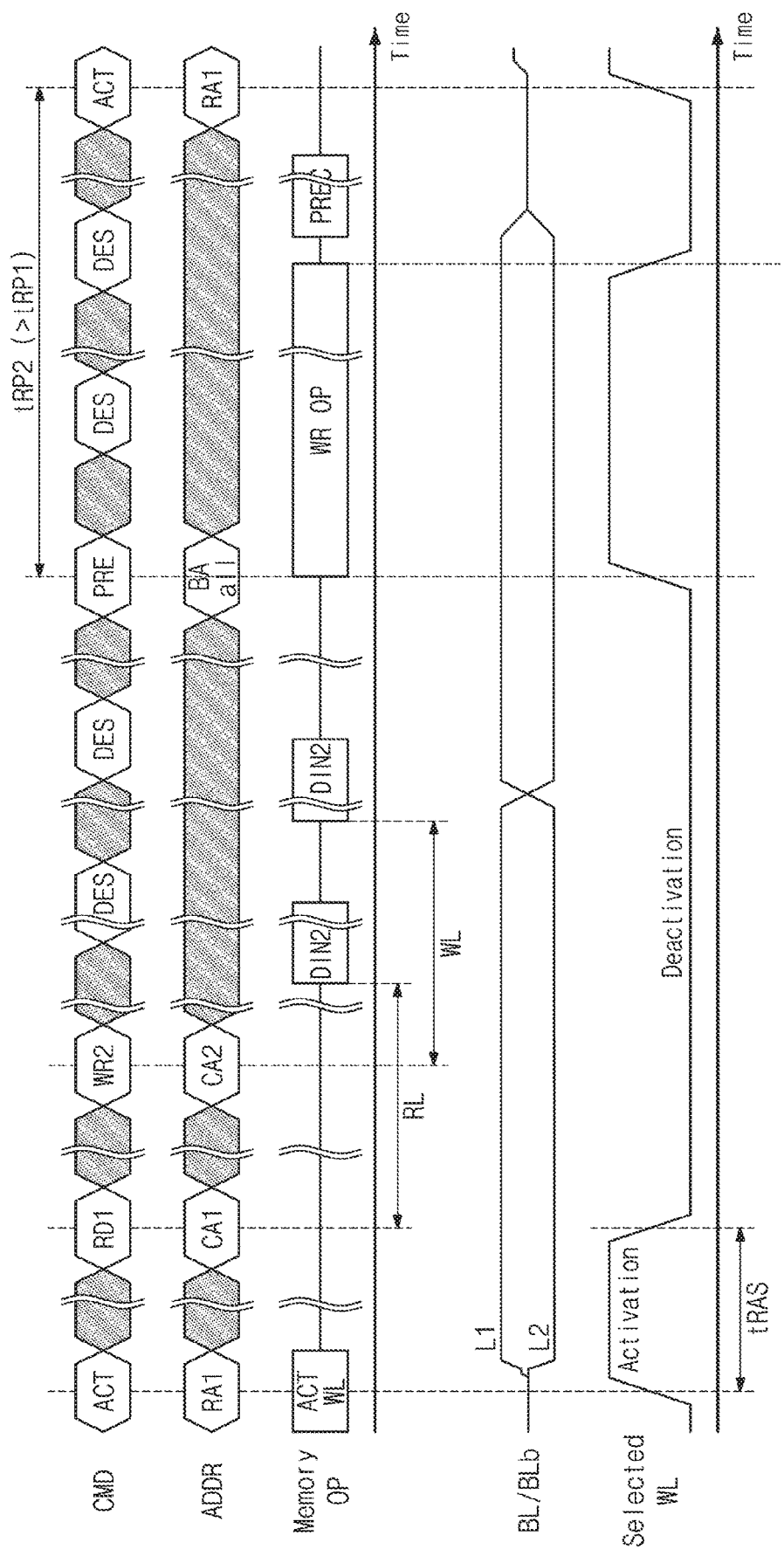

FIGS. 10A and 10B are timing diagrams for describing an operation of a memory device of FIG. 7 according to at least one example embodiment. At least one example embodiment in which the write command WR is not received between the activate command ACT and the precharge command PRE will be described with reference to FIG. 10A, and at least one example embodiment in which the write command WR is received between the activate command ACT and the precharge command PRE will be described with reference to FIG. 10B. For the brevity of illustration and for convenience of description, it is assumed that two operation commands are received between the activate command ACT and the precharge command PRE. However, the example embodiments of the inventive concepts are not limited thereto.

Referring to FIGS. 7 and 10A, the memory device 200 may receive the activate command ACT and the first row address RA1, etc., from a memory controller. In response to the activate command ACT, the memory device 200 may select a word line corresponding to the first row address RA1 and may activate the selected word line. For example, as illustrated in FIG. 10A, the memory device 200 may activate the selected word line by applying a high voltage to the selected word line.

As the memory device 200 activates the selected word line, a charge sharing operation, a sensing operation, and/or a restore operation, etc., may be performed with regard to memory cells connected to the selected word line. For example, while the selected word line is activated, as illustrated in FIG. 10A, a voltage of a bit line BL and a voltage of a complementary bit line BLb may respectively transition to a first level L1 and a second level L2, based on data stored in a memory cell connected to the selected word line and the bit line BL, but the example embodiments are not limited thereto.

The memory device 200 may deactivate the selected word line after the activate reference time tRAS elapses from a time at which the activate command ACT is received. For example, the memory device 200 may apply a low voltage to the selected word line after the activate reference time tRAS elapses from a time at which the activate command ACT is received. In at least one example embodiment, the activate reference time tRAS may be not less than a desired and/or minimum time desired and/or necessary to store data stored in memory cells connected to the selected word line to the input/output circuit 250. Additionally, the activate reference time tRAS may be a desired and/or minimum time desired and/or necessary to perform the following operation on the memory cells connected to the selected word line: a sensing operation, a charge sharing operation, and/or a restore operation, but the example embodiments are not limited thereto.

Afterwards, the memory device 200 may receive the first read command RD1 and the first column address CA1 from the memory controller and may receive the second read command RD2 and the second column address CA2 from the memory controller. The memory device 200 may perform the first data output operation DOUT1 in response to the first read command RD1 and the first column address CAL and may perform the second data output operation DOUT2 in response to the second read command RD2 and the second column address CA2. The above operations are similar to the operations described with reference to FIG. 6A, and thus, additional description will be omitted to avoid redundancy.

In at least one example embodiment, as illustrated in FIG. 10A, even though the selected word line is deactivated, the first and second data output operations DOUT1 and DOUT2 may be performed normally because the voltages of the bit line BL and the complementary bit line BLb are kept (e.g., maintained).

The memory device 100 may receive the precharge command PRE from the memory controller and may perform the precharge operation PREC in response to the received precharge command PRE.

As in the description given with reference to FIG. 6A, the memory device 200 may receive the activate command ACT after the first precharge reference time tRP1 elapses from a time at which the precharge command PRE is received. This is described with reference to FIG. 6A, and thus, additional description will be omitted to avoid redundancy.

Referring to FIGS. 7 and 10B, the memory device 200 may receive the activate command ACT and the first row address RA1, etc., from the memory controller. In response to the activate command ACT, the memory device 200 may select a word line corresponding to the first row address RA1 and may activate the selected word line. The memory device 200 may deactivate the selected word line after the activate reference time tRAS elapses from a time at which the activate command ACT is received. The above operation is similar to the operation described with reference to FIG. 10A, and thus, additional description will be omitted to avoid redundancy.

Afterwards, the memory device 200 may receive the first read command RD1 and the first column address CA1 from the memory controller, and may receive the second write command WR2 and the second column address CA2 from the memory controller. As in the description given with reference to FIG. 6B, the memory device 200 may perform the first data output operation DOUT1 in response to the first read command RD1 and the first column address CA1, and may perform the second data input operation DIN2 in response to the second write command WR2 and the second column address CA2.

In this case, the second data input operation DIN2 refers to an operation of storing write data from the memory controller to the input/output circuit 250 (and/or a sense amplifier unit, etc.). In the case where the input write data is different from the current data defined by a voltage of the bit line BL and a voltage of the complementary bit line BLb, as illustrated in FIG. 10B, the voltages of the bit line BL and the complementary bit line BLb may be changed by the second data input operation DIN2. In this case, since the selected word line is deactivated, the input write data may not be written to the memory cells connected to the selected word line. That is, the memory device 200 may not perform (e.g., may avoid performing) the cell write operation in response to the second write command WR2 and the second column address CA2.

Afterwards, the memory device 200 may receive the precharge command PRE from the memory controller. In the example embodiment of FIG. 10B, since a write command (i.e., the second write command WR2) exists between the activate command ACT and the precharge command PRE, for the purpose of performing a cell write operation corresponding to the second write command WR2, the memory device 200 may activate the selected word line and may perform the cell write operation WR OP.

For example, the memory device 200 may activate the selected word line, and may directly write the input write data corresponding to the changed levels of the bit line BL and the complementary bit line BLb to the memory cells connected to the selected word line. After the cell write operation WR OP is completed, the memory device 200 may deactivate the selected word line and may perform the precharge operation PREC on bit lines.

As in the description given with reference to FIG. 6B, the memory device 200 may receive the activate command ACT after the second precharge reference time tRP2 elapses after a time at which the precharge command PRE is received. This is described with reference to FIG. 6B, and thus, additional description will be omitted to avoid redundancy.

As described above, the memory device 200 according to at least one example embodiment of the inventive concepts may activate the selected word line in response to the activate command ACT; regardless of whether the precharge command PRE is received, the memory device 200 may deactivate the selected word line after the activate reference time tRAS elapses. According to the above word line control scheme, disturbance due to a high voltage applied to a selected word line may be decreased and/or prevented.

Also, in the case where the write command WR exists between the activate command ACT and the precharge command PRE, the memory device 200 according to at least one example embodiment of the inventive concepts activates the selected word line in response to the precharge command PRE and performs the direct write operation corresponding to the write command WR. Accordingly, even though the write command WR is received while the selected word line is deactivated, a normal operation is possible. This may mean that the memory device having improved reliability over conventional memory devices is provided.

Figure 11:
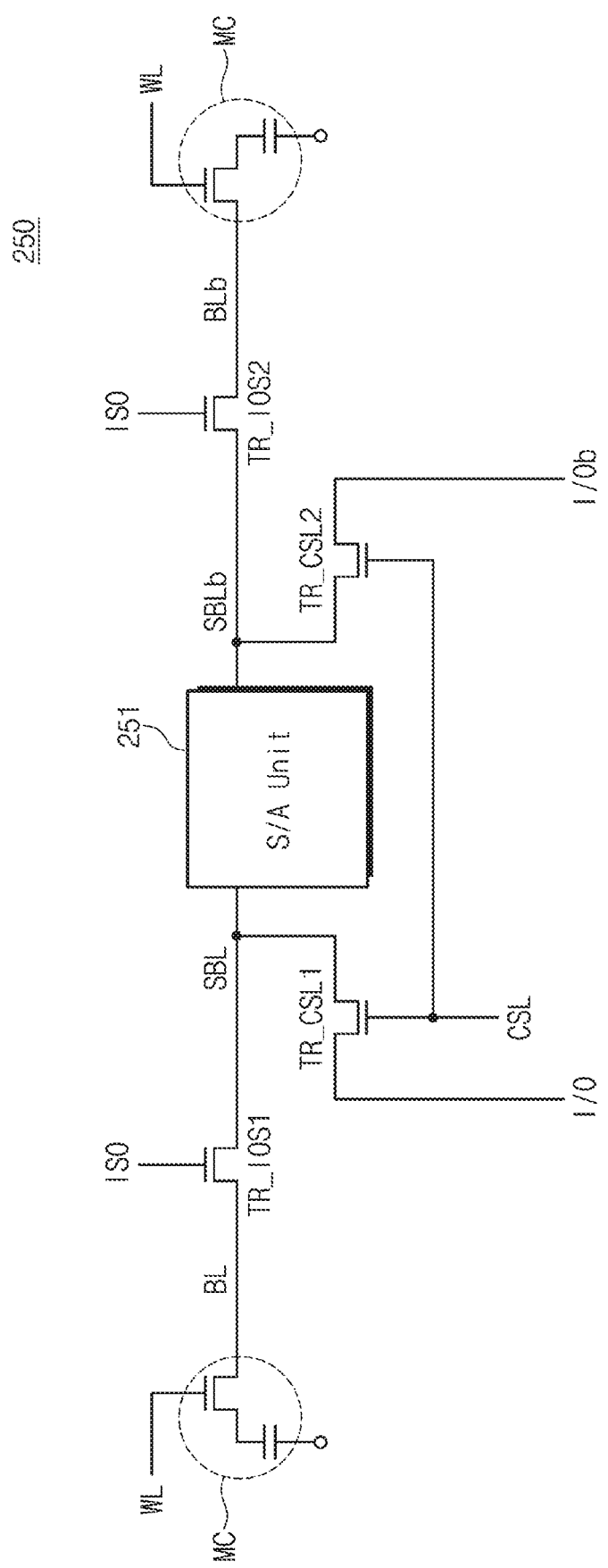
FIG. 11 is a diagram illustrating a part of an input/output circuit of FIG. 7 according to at least one example embodiment.

FIG. 11 is a diagram illustrating a part of an input/output circuit of FIG. 7 according to at least one example embodiment. For the convenience of description, at least one example embodiment of the inventive concepts will be described with reference to one sense amplifier unit 251 included in the input/output circuit 250, but the example embodiments are not limited thereto.

Referring to FIGS. 7 and 10, the sense amplifier unit 251 is connected to a sense bit line SBL and a complementary sense bit line SBLb. The sense amplifier unit 251 may be configured to amplify and/or retain levels of the sense bit line SBL and the complementary sense bit line SBLb.

A first isolation transistor TR_ISO1 is connected between the bit line BL and the sense bit line SBL and operates in response to an isolation signal ISO. A second isolation transistor TR_ISO2 is connected between the complementary bit line BLb and the complementary sense bit line SBLb and operates in response to the isolation signal ISO.

The first and second isolation transistors TR_ISO1 and TR_ISO2 may operate to isolate the sense amplifier unit 251 from the bit line BL and the complementary bit line BLb in response to the isolation signal ISO. As the sense amplifier unit 251 is isolated from the bit line BL and the complementary bit line BLb by the first and second isolation transistors TR_ISO1 and TR_ISO2, signal disturbance due to the voltages (e.g., the high voltages) of the bit line BL and the complementary bit line BLb may be decreased and/or prevented.

A first column selection transistor TR_CSL1 is connected between an input/output line I/O and the sense bit line SBL and operates in response to a column selection signal CSL, but the example embodiments are not limited thereto. A second column selection transistor TR_CSL2 is connected between a complementary input/output line I/Ob and the complementary sense bit line SBLb and operates in response to the column selection signal CSL, but the example embodiments are not limited thereto.

As the first and second column selection transistors TR_CSL1 and TR_CSL2 operate in response to the column selection signal CSL, data retained in the sense amplifier unit 251 may be provided to the outside (i.e., a memory controller, external source, and/or external device, etc.) through the input/output line I/O and the complementary input/output line I/Ob, or write data may be stored to the sense amplifier unit 251 from the outside through the input/output line I/O and the complementary input/output line I/Ob. For example, as the first and second column selection transistors TR_CSL1 and TR_CSL2 are turned on by the column selection signal CSL, the data output operation DOUT corresponding to the read command RD and the data input operation DIN corresponding to the write command WR may be performed.

Figure 12A:
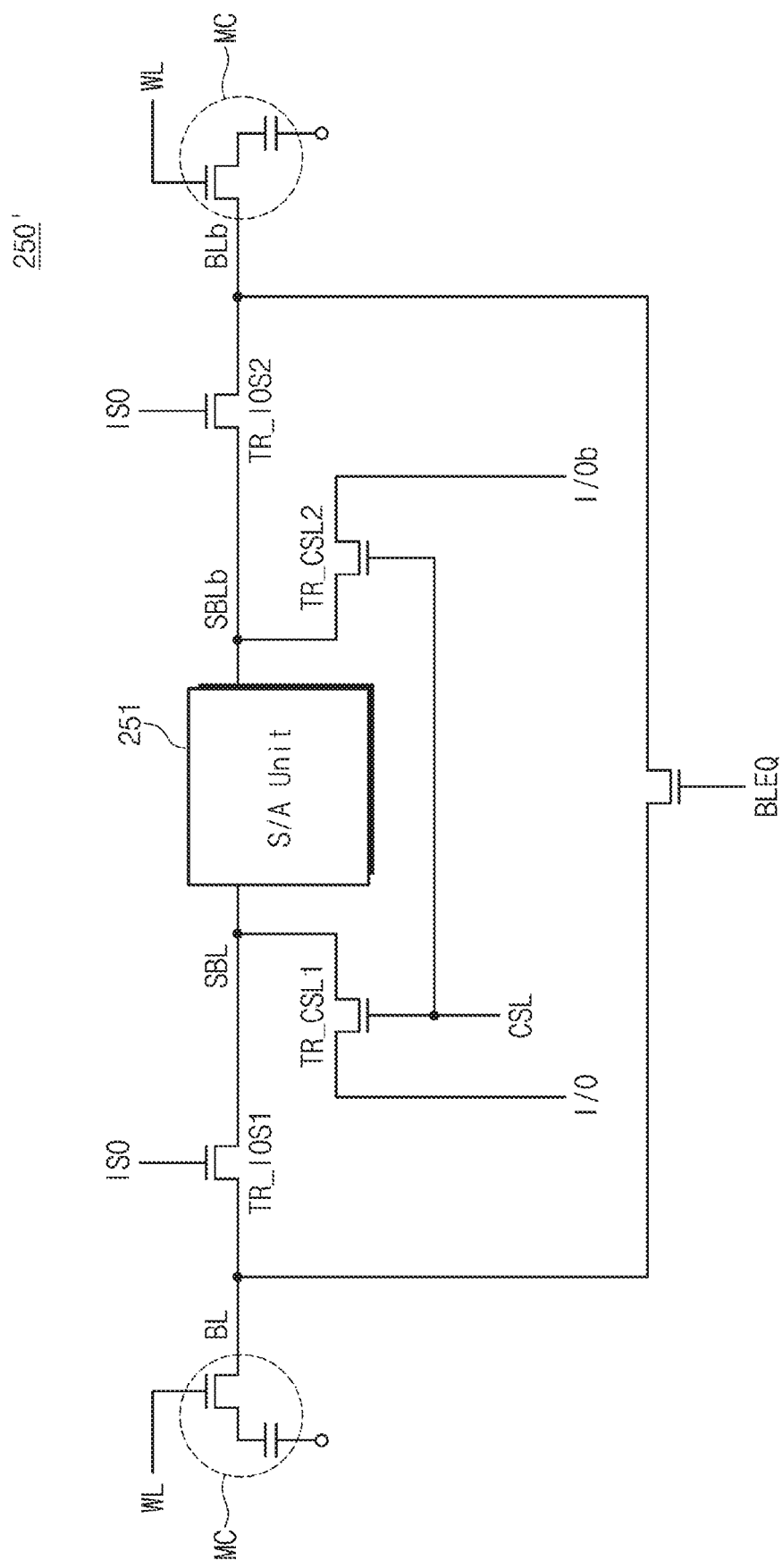
FIG. 12A is a diagram illustrating a configuration associated with a part of an input/output circuit of FIG. 7 according to at least one example embodiment.
Figure 12B:
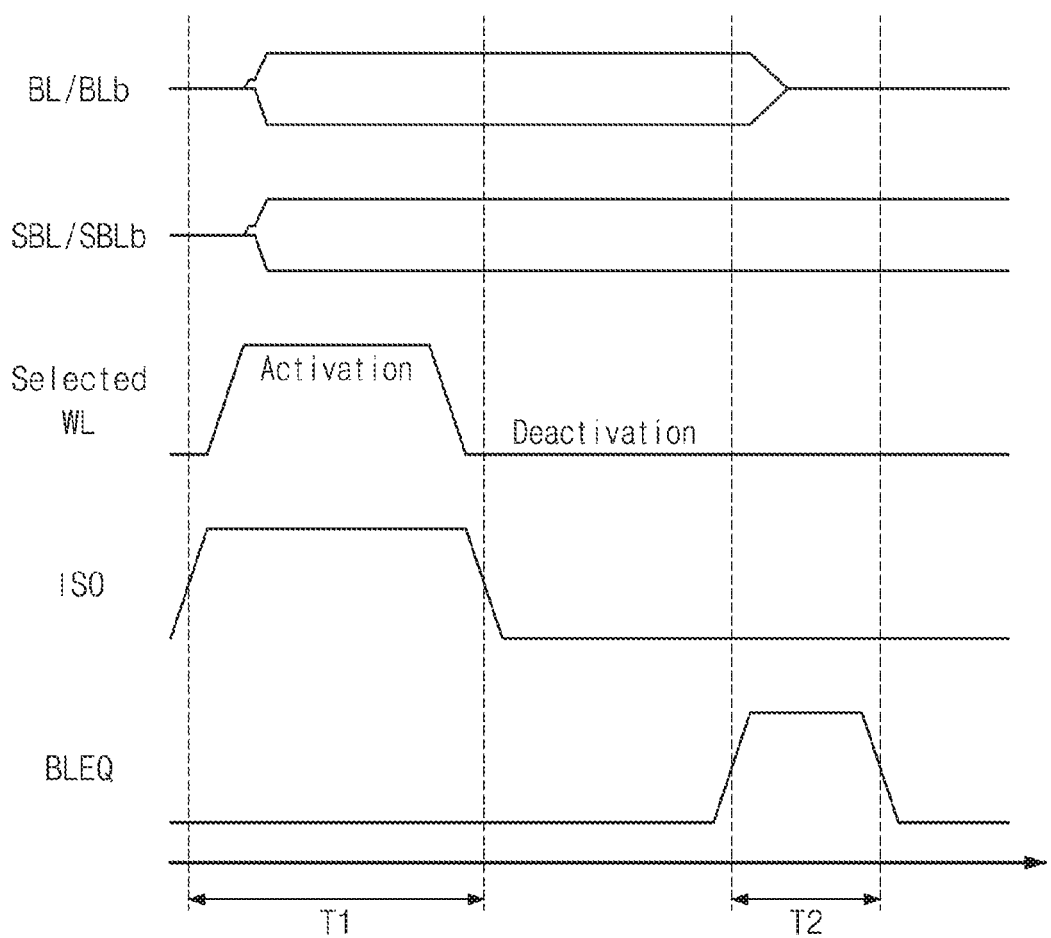
FIG. 12B is a timing diagram illustrating signals of a memory device of FIG. 12A according to at least one example embodiment.

FIG. 12A is a diagram illustrating a configuration associated with a part of an input/output circuit of FIG. 7 according to at least one example embodiment. FIG. 12B is a timing diagram illustrating signals of a memory device of FIG. 12A according to at least one example embodiment. For the convenience of description, with regard to the above-described components, additional description will be omitted to avoid redundancy.

Compared with the input/output circuit 250 of FIG. 11, an input/output circuit 250' of FIG. 12A may further include an equalization transistor TR_EQ which is connected between the bit line BL and the complementary bit line BLb and operates in response to a bit line equalization signal BLEQ, but the example embodiments are not limited thereto. As the equalization transistor TR_EQ operates in response to the bit line equalization signal BLEQ, the bit line BL and the complementary bit line BLb may be equalized.

For example, as illustrated in FIG. 12B, a selected word line may be activated during a first time T1. In this case, the isolation signal ISO may maintain a level of logical high (e.g., data value corresponding to "1", etc.) for the purpose of performing the following operations on memory cells connected to the selected word line: a sensing operation, a charge sharing operation, and/or a restore operation, etc. When the first and second isolation transistors TR_ISO1 and TR_ISO2 are turned on in response to the isolation signal ISO of logical high, the bit BL and the complementary bit line BLb may be connected to the sense bit line SBL and the complementary sense bit line SBLb, respectively.

As operations such as a sensing operation, a charge sharing operation, and/or a restore operation, etc., are performed on the memory cells connected to the selected word line during the first time T1, the bit line BL and the complementary bit line BLb and the sense bit line SBL and the complementary sense bit line SBLb may maintain the corresponding levels as illustrated in FIG. 12B.

Afterwards, the selected word line may be deactivated, and the isolation signal ISO may decrease to a level of logical low (e.g., a data value corresponding to "0", etc.). When the first and second isolation transistors TR_ISO1 and TR_ISO2 are turned off in response to the isolation signal ISO of logical low, the bit line BL and the complementary bit line BLb may be isolated from the sense bit line SBL and the complementary sense bit line SBLb, respectively.

Afterwards, the bit line equalization signal BLEQ may be maintained at a level of logical high during a second time T2. When the equalization transistor TR_EQ is turned on in response to the bit line equalization signal BLEQ of logical high, the bit line BL and the complementary bit line BLb may be equalized to the same level (e.g., a precharge voltage). In at least one example embodiment, since the bit line BL and the sense bit line SBL are isolated from each other by the first isolation transistor TR_ISO1, and the complementary bit line BLb and the complementary sense bit line SBLb are isolated from each other by the second isolation transistor TR_ISO2, the levels of the sense bit line SBL and the complementary sense bit line SBLb may be maintained by the sense amplifier unit 251.

That is, signal disturbance and/or data disturbance due to the high voltage levels of bit lines may be decreased and/or prevented by equalizing the bit line BL and the complementary bit line BLb to the same level after data stored in memory cells connected to the selected word line are stored to the sense amplifier unit 251 (and/or are stored on the sense bit line SBL and the complementary sense bit line SBLb, etc.). In addition, since data stored in the memory cells connected to the selected word line are stored to the sense amplifier unit 251, the following data output operation and/or the following data write operation may be performed normally. This may mean that a memory device having improved reliability is provided.

In at least one example embodiment, the control signals ISO, CSL, and BLEQ described with reference to FIGS. 11 and 12A may be controlled by the control logic circuit 240. The control logic circuit 240 may generate the control signals ISO, CSL, and BLEQ in response to the activate command ACT, the write command WR, the read command RD, and/or the deactivate signal, etc., from the timer 270, but the example embodiments are not limited thereto.

Figure 13:
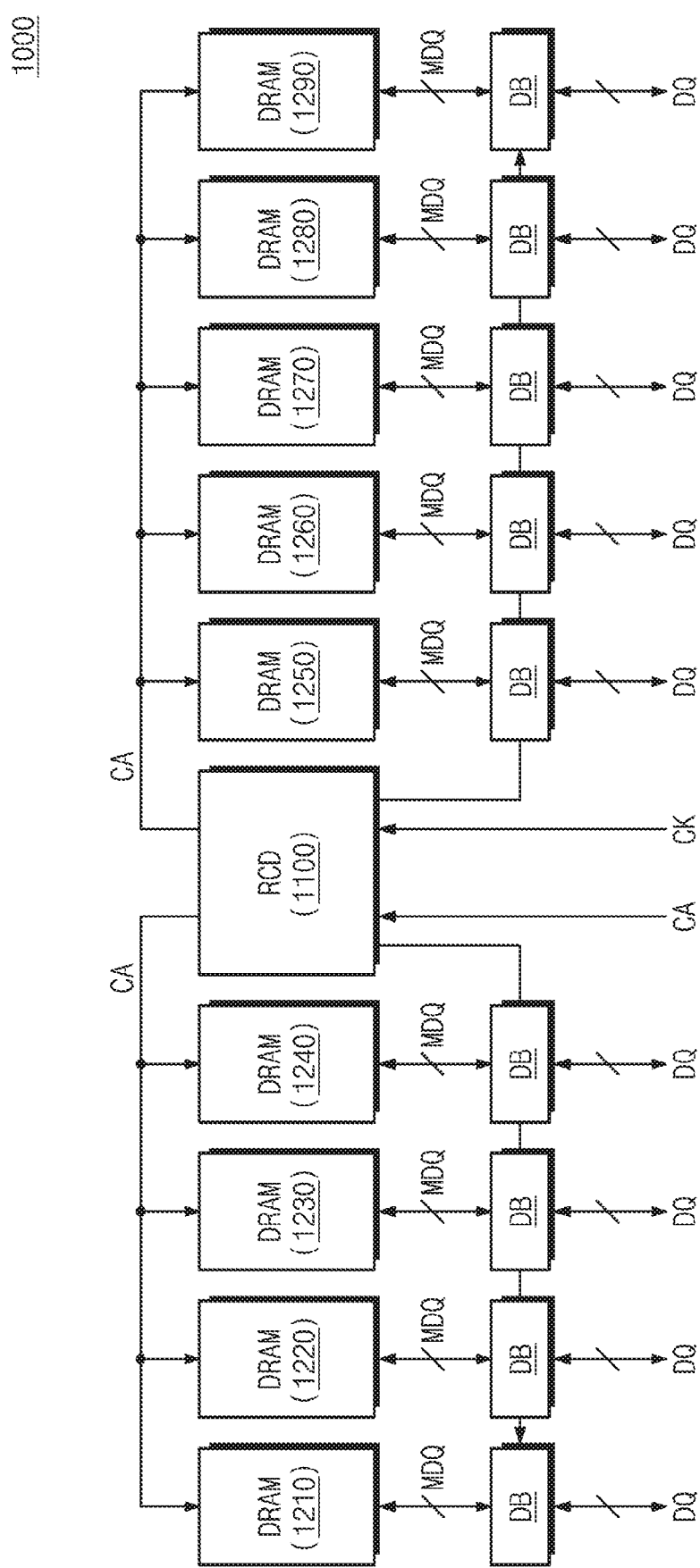
FIG. 13 is a block diagram illustrating a memory module to which a memory device according to according to at least one example embodiment of the inventive concepts.

FIG. 13 is a block diagram illustrating a memory module to which a memory device according to at least one example embodiment of the inventive concepts. Referring to FIG. 15, a memory module 1000 may include a register clock driver (RCD) 1100, a plurality of DRAM devices 1210 to 1290, and/or a plurality of data buffers DB, etc., but the example embodiments are not limited thereto. The RCD 1100 may receive a command/address CA and a clock signal CK from an external device (e.g., an external source, such as a host and/or a memory controller, etc.). In response to the received signals, the RCD 1100 may transmit the command/address CA to the plurality of DRAM devices 1210 to 1290 and may control the plurality of data buffers DB.

The plurality of DRAM devices 1210 to 1290 may be respectively connected with the plurality of data buffers DB through memory data lines MDQ. In at least one example embodiment, the DRAM devices 1210 to 1290 may be implemented with the memory device 100 or 200 of FIG. 1 or 7, or may operate based on the operation method described with reference to FIGS. 1 to 12B, but the example embodiments are not limited thereto. The plurality of data buffers DB may transmit and/or receive data to and/or from an external device (e.g., a host, a memory controller, etc.) through a plurality of data lines DQ.

In at least one example embodiment, the memory module 1000 illustrated in FIG. 13 may have the form factor of a load reduced dual in-line memory module (LRDIMM). However, the example embodiments of the inventive concepts are not limited thereto. For example, the memory module 1000 may have the form factor of a registered DIMM (RDIMM) in which the plurality of data buffers DB are not included, etc.

Figure 14:
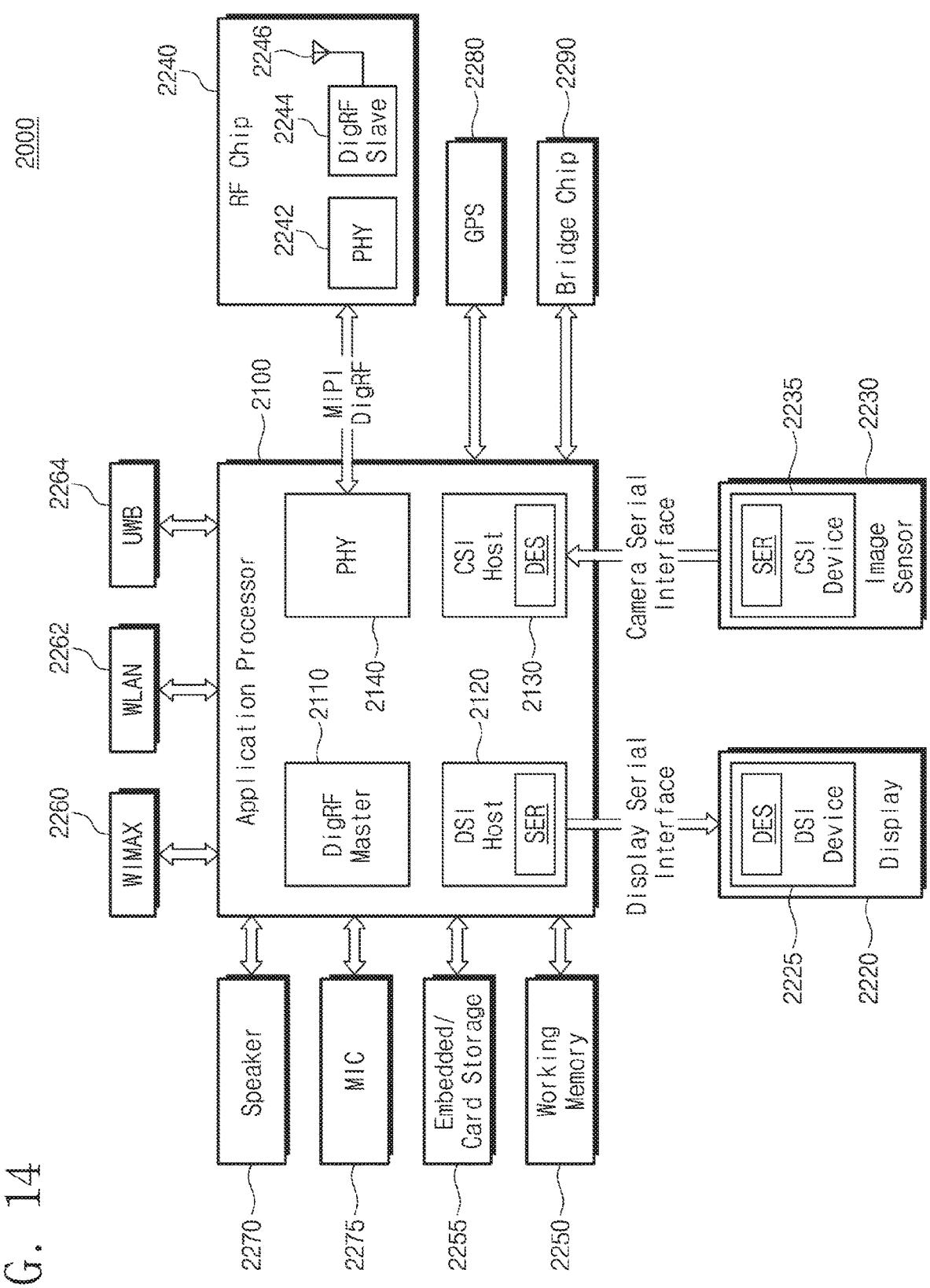
FIG. 14 is a block diagram illustrating an electronic system to which a memory device according to at least one example embodiment of the inventive concepts.

FIG. 14 is a block diagram illustrating an electronic system to which a memory device according to at least one example embodiment of the inventive concepts. Referring to FIG. 14, an electronic system 2000 may be implemented in the form of a portable communication terminal, a personal digital assistant (PDA), a portable multimedia player (PMP), a smartphone, a virtual reality device, an augmented reality device, and/or a wearable device, etc., and/or in the form of a computing system such as a personal computer, a server, a workstation, a laptop, and/or a notebook computer, etc.

The electronic system 2000 may include at least one application processor 2100 (and/or a central processing unit), a display 2220, and/or an image sensor 2230, but the example embodiments are not limited thereto. The application processor 2100 may include a DigRF master 2110, a display serial interface (DSI) host 2120, a camera serial interface (CSI) host 2130, and/or a physical layer 2140, but the example embodiments are not limited thereto.

The DSI host 2120 may communicate with a DSI device 2225 of the display 2220 through the DSI. In at least one example embodiment, an optical serializer circuit SER may be implemented in the DSI host 2120. An optical deserializer circuit DES may be implemented in the DSI device 2225. The CSI host 2130 may communicate with a CSI device 2235 of the image sensor 2230 through the CSI. In at least one example embodiment, an optical deserializer circuit DES may be implemented in the CSI host 2130, but the example embodiments are not limited thereto. For example, an optical serializer circuit SER may be implemented in the CSI device 2235, but the example embodiments are not limited thereto.

The electronic system 2000 may communicate with the application processor 2100 and may further include a radio frequency (RF) chip 2240 including a physical layer 2242, a DigRF slave 2244, and/or an antenna 2246, etc. In at least one example embodiment, the physical layer 2242 of the RF chip 2240 and the physical layer 2140 of the application processor 2100 may exchange data with each other through an MIPI DigRF interface.

The electronic system 2000 may further include a working memory 2250 and embedded/card storage 2255, etc. The working memory 2250 and the embedded/card storage 2255 may store data provided from the application processor 2100. The working memory 2250 and the embedded/card storage 2255 may provide the data stored therein to the application processor 2100. The working memory 2250 may temporarily store data processed or to be processed by the application processor 2100. In at least one example embodiment, the working memory 2250 may be a memory device described with reference to FIGS. 1 to 12B. Additionally, the working memory 2250 may operate based on the operation method described with reference to FIGS. 1 to 12B, but the example embodiments are not limited thereto.

The electronic system 2000 may communicate with an external system through a wired and/or wireless network, such as a worldwide interoperability for microwave access (WiMAX) 2260, a wireless local area network (WLAN) 2262, and/or an ultra-wideband (UWB) 2264, etc.

The electronic system 2000 may further include a speaker 2270 and/or a microphone 2275, etc., for the purpose of processing voice information. In at least one example embodiment, the electronic system 2000 may further include a global positioning system (GPS) device 2280, etc., for processing position information. The electronic system 2000 may further include a bridge chip 2290 for managing connections between peripheral devices.

According to at least one example embodiment of the inventive concepts, a memory device with improved reliability and an operation method thereof are provided.

While the inventive concepts have been described with reference to various example embodiments thereof, it will be apparent to those of ordinary skill in the art that various changes and modifications may be made thereto without departing from the spirit and scope of the inventive concepts as set forth in the following claims.

What is claimed is:

1. An operation method of a memory device, the memory device including a plurality of dynamic random access memory (DRAM) cells connected to a plurality of word lines, the method comprising:
   receiving a first activate command from an external source;
   receiving at least one operation command from the external source;
   receiving a precharge command;
   determining whether the at least one operation command includes a write command; and
   in response to results of the determining indicating the at least one operation command does not include the write command, receiving a second activate command from the external source after a first precharge reference time period elapses, the first precharge reference time period starting at a time when the precharge command is received, and
   in response to results of the determining indication the at least one operation command including the write command, receiving the second activate command from the external source after a second precharge reference time period elapses, the second precharge reference time period starting at the time when the precharge command is received.

2. The method of claim 1, wherein the second precharge reference time period is longer than the first precharge reference time period.

3. The method of claim 1, further comprising:
   activating a selection word line among the plurality of word lines in response to the first activate command; and
   deactivating the selection word line after an activate reference time period elapses, the activate reference time period starting at a time when the first activate command is received.

4. The method of claim 3, further comprising:
   in response to the at least one operation command including the write command, reactivating the deactivated selection word line in response to the precharge command during the second precharge reference time period; and
   writing write data corresponding to the write command to selection memory cells connected to the reactivated selection word line.

5. The method of claim 4, further comprising:
   receiving the write data after a write latency period elapses, the write latency period starting at a time at which the write command is received.

6. The method of claim 5, further comprising:
   deactivating the reactivated selection word line; and
   precharging bit lines connected to the selection memory cells.

7. The method of claim 1, further comprising:
   determining whether the at least one operation command includes a read command; and
   in response to the at least one operation command including the read command, outputting read data corresponding to the read command after a read latency period, the read latency period starting at a time at when the read command is received.

8. An operation method of a memory device, the memory device including a plurality of memory cells connected to a plurality of word lines, the method comprising:
   receiving an activate command from an external source;
   receiving at least one operation command from the external source;
   receiving a precharge command from the external source;
   determining whether the at least one operation command includes a write command;
   receiving an additional active command from the external source;
   in response to the results of the determining indication the at least one operation command does not include the write command, receiving the additional activate command after a first precharge reference time period elapses, the first precharge reference time period starting from a time when the precharge command is received; and in response to the results of the determining indicating the at least one operation command includes the write command, receiving the additional activate command after a second precharge reference time period longer than the first precharge reference time period elapses, the second precharge reference time period starting from the time at which the precharge command is received, and writing write data corresponding to the write command to selection memory cells connected to a selection word line among the plurality of word lines after receiving the precharge command.

9. The method of claim 8, further comprising:
receiving the write data from the external source after a write latency period elapses, the write latency period starting at a time when the write command is received.

10. The method of claim 8, further comprising:
activating the selection word line among the plurality of word lines in response to the activate command; and
deactivating the activated selection word line after an activate reference time period elapses, the activate reference time period starting at the time when the activate command is received.

11. The method of claim 10, further comprising:
reactivating the deactivated selection word line in response to the precharge command; and
writing the write data to the selection memory cells connected to the reactivated selection word line.

12. The method of claim 10, further comprising:
isolating bit lines connected to the selection memory cells from an input/output circuit; and
equalizing the bit lines isolated from the input/output circuit.

13. The method of claim 8, further comprising:
precharging bit lines connected to the selection memory cells in response to the precharge command.

14. A memory device comprising:
a memory cell array including a plurality of dynamic random access memory (DRAM) cells connected to a plurality of word lines and a plurality of bit lines;
a row decoder configured to select a selection word line among the plurality of word lines based on a row address from an external source;
a column decoder configured to select a selection bit line among the plurality of bit lines based on a column address from the external source;
an input/output circuit connected to the plurality of bit lines and configured to exchange data with the external source;
a command decoder configured to decode an activate command, at least one operation command, and a precharge command received from the external source;
a write command detector circuit configured to detect a write command from the at least one operation command based on a decoding result of the command decoder; and
a control logic circuit configured to,
activate the selection word line in response to the activate command,
in response to the write command not being detected, receive an additional activate command after a first precharge reference time period elapses, the first precharge reference time period starting from a time when the precharge command is received; and in response to the write command being detected, the control logic circuit is further configured to receive the additional activate command after a seond precharge reference time period longer than the first precharge reference time period elapses, the second precharge reference time period starting from the time at which the precharge command is received, and
write write data corresponding to the write command to selection memory cells from among the plurality of DRAM memory cells, the selection memory cells being connected to the selection word line, after receiving the precharge command.

15. The memory device of claim 14, wherein
the at least one operation command is received after the activate command is received; and
the precharge command is received after the at least one operation command is received.

16. The memory device of claim 14, further comprising:
a timer configured to,
count an activate reference time period, the activate reference time period starting from a time when the activate command is received; and
output a deactivate signal in response to the activate reference time period elapsing.

17. The memory device of claim 16, wherein the control logic circuit is further configured to deactivate the selection word line in response to the deactivate signal.

18. The memory device of claim 17, wherein the input/output circuit includes:
a sense amplifier unit connected to a sense bit line and a complementary sense bit line;
a first isolation transistor connected between a first bit line of the bit lines and the sense bit line and configured to operate in response to an isolation signal;
a second isolation transistor connected between a second bit line of the bit lines and the complementary sense bit line and configured to operate in response to the isolation signal;
a first column selection transistor connected between the sense bit line and an input/output line connected to the external source and configured to operate in response to a column selection signal;
a second column selection transistor connected between the complementary sense bit line and a complementary input/output line connected to the external source and configured to operate in response to the column selection signal; and
a bit line equalization transistor connected between the first and second bit lines and configured to operate in response to a bit line equalization signal.

19. The memory device of claim 18, wherein the control logic circuit is further configured to:
in response to the activate command, control the isolation signal such that the first and second isolation transistors are turned on, and control the bit line equalization signal such that the bit line equalization transistor is turned off;
in response to the deactivate signal, control the isolation signal such that the first and second isolation transistors are turned off, and control the bit line equalization signal such that the bit line equalization transistor is turned on; and
in response to the at least one operation command, control the column selection signal such that the first and second column selection transistors are turned on.

* * * * *